United States Patent
Lazar et al.

(10) Patent No.: US 10,162,034 B2
(45) Date of Patent: *Dec. 25, 2018

(54) MAGNETIC RESONANCE SCANNER AND ANTENNA

(71) Applicant: SIEMENS AKTIENGESELLSCHAFT, Munich (DE)

(72) Inventors: Razvan Lazar, Erlangen (DE); Martin Schramm, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 1272 days.

This patent is subject to a terminal disclaimer.

(21) Appl. No.: 14/250,484

(22) Filed: Apr. 11, 2014

(65) Prior Publication Data

US 2014/0306702 A1    Oct. 16, 2014

(30) Foreign Application Priority Data

Apr. 12, 2013   (DE) .......................... 10 2013 206 555

(51) Int. Cl.
   *G01R 33/565*   (2006.01)
   *G01R 33/34*    (2006.01)

(52) U.S. Cl.
   CPC ........... *G01R 33/565* (2013.01); *G01R 33/34* (2013.01); *G01R 33/34007* (2013.01); *G01R 33/56509* (2013.01); *G01R 33/34046* (2013.01)

(58) Field of Classification Search
   CPC ........ G01R 33/34007; G01R 33/34046; G01R 33/288; G01R 33/34; G01R 33/56; G01R 33/565; G01R 33/56509
   USPC .................................................. 324/318–322
   See application file for complete search history.

(56) References Cited

U.S. PATENT DOCUMENTS

| | | | |
|---|---|---|---|
| 2004/0061499 A1* | 4/2004 | Stocker .............. | G01R 33/3854 324/318 |
| 2004/0155658 A1 | 8/2004 | Schuster et al. | |
| 2008/0309343 A1* | 12/2008 | Yamamizu ............. | A61B 5/055 324/320 |
| 2010/0176811 A1* | 7/2010 | Tsuda ................. | G01R 33/3806 324/318 |

(Continued)

FOREIGN PATENT DOCUMENTS

| | | |
|---|---|---|
| DE | 10253701 A1 | 6/2004 |
| JP | 2006136388 A | 6/2006 |

OTHER PUBLICATIONS

German Office Action dated Sep. 13, 2013 for corresponding German Patent Application No. DE 10 2013 206 555.8 with English translation.

(Continued)

*Primary Examiner* — Rishi Patel
(74) *Attorney, Agent, or Firm* — Lempia Summerfield Katz LLC

(57) ABSTRACT

The embodiments relate to a magnetic resonance scanner including an antenna system having an adjustment device for modifying the natural frequency of a natural mechanical oscillation mode of the antenna system. According to the embodiments, in a method for operating a magnetic resonance imaging system having a magnetic resonance scanner comprising an antenna system, a natural frequency of a natural mechanical oscillation mode of the antenna system is controlled and/or regulated.

20 Claims, 9 Drawing Sheets

(56) References Cited

U.S. PATENT DOCUMENTS

2013/0147481 A1* 6/2013 Miyawaki ........ G01R 33/56518
                                                    324/309
2013/0234713 A1* 9/2013 Maciejewski .... G01R 33/34007
                                                    324/321
2013/0285659 A1* 10/2013 Sohn ................ G01R 33/34092
                                                    324/314
2014/0306706 A1* 10/2014 Lazar .................. G01R 33/288
                                                    324/309

OTHER PUBLICATIONS

German Office Action dated Sep. 13, 2013 for corresponding German Patent No. DE 10 2013 206 555.8 with English translation.

* cited by examiner

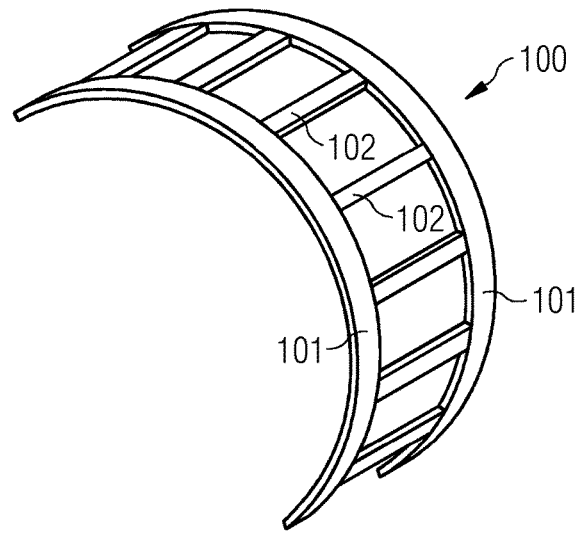
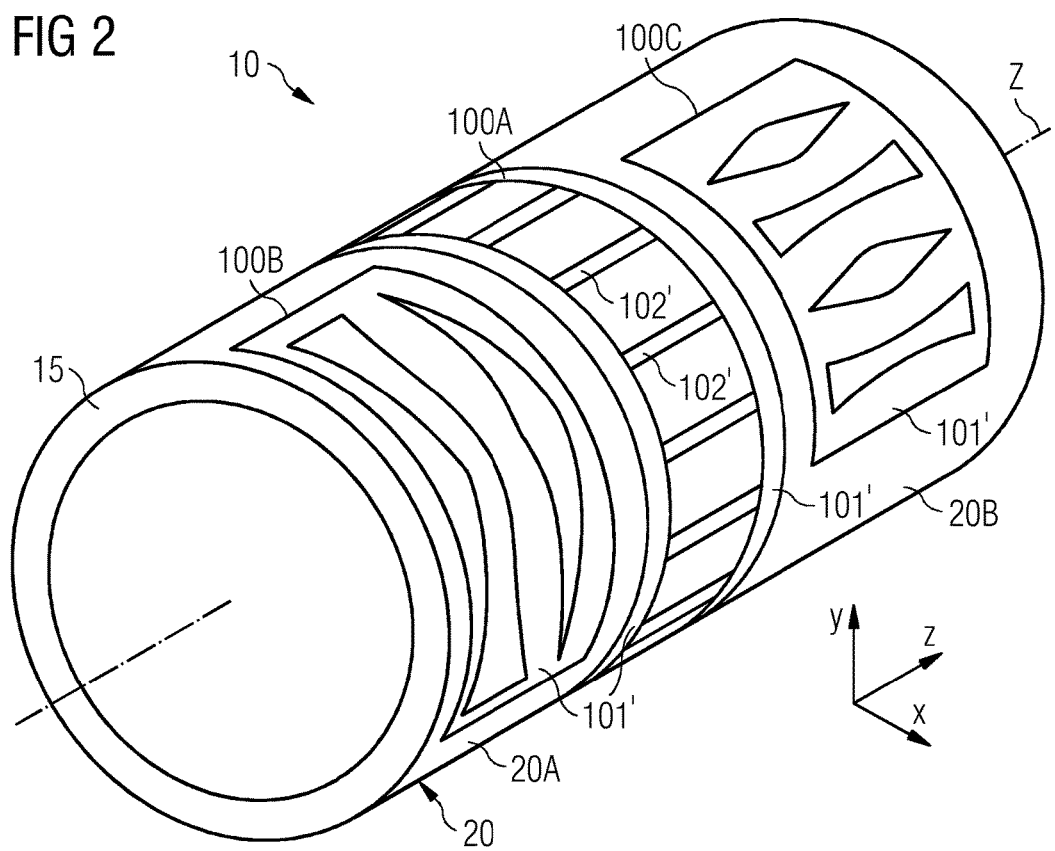

MAGNETIC RESONANCE SCANNER AND ANTENNA

CROSS-REFERENCE TO RELATED APPLICATIONS

This application claims the benefit of DE 10 2013 206 555.8, filed on Apr. 12, 2013, which is hereby incorporated by reference in its entirety.

TECHNICAL FIELD

The embodiments relate to a magnetic resonance scanner having an antenna system, to a magnetic resonance imaging system having such a magnetic resonance scanner, to a method for operating a magnetic resonance imaging system, and to a method for setting a natural frequency of an antenna system of a magnetic resonance scanner.

BACKGROUND

Magnetic resonance tomography is a widespread method for obtaining images of the interior of a body. In this method, the body to be examined is exposed to a relatively strong base magnetic field, for example, with a strength of several tesla. A radiofrequency excitation signal (the so-called $B_1$ field) is emitted using a suitable antenna system, the effect of which is to tilt the nuclear spins of particular atoms resonantly excited by this radiofrequency field through a particular flip angle relative to the magnetic field lines of the base magnetic field. The radiofrequency signal radiated during the relaxation of the nuclear spins, the so-called magnetic resonance signal, is picked up in suitable antenna systems, which may also be the same as the transmission antenna system. The raw data acquired in this way are used in order to reconstruct the desired image data. For position encoding, defined magnetic field gradients are respectively superimposed on the base magnetic field by gradient coils during the transmission and readout, or reception, of the radiofrequency signals. The rapidly switched fields and currents resulting, or used, in this case lead to an interaction with the base magnetic field and/or metallic components of the MR system, so that perturbing vibrations that are detrimental to the imaging may occur in the MR system.

Different types of antenna systems may be used for the transmission and readout, respectively. For example, it is possible to use so-called local coils that may be placed on the patient. It is also conceivable for the local coils to be connected by a suspension system to parts of the magnetic resonance imaging system, for example, the patient table, and for the local coils to be arranged at a maximum distance of a few centimeters from the patient.

Magnetic resonance imaging systems furthermore may have antenna systems that are located at a somewhat larger distance from the patient, for example, a few tens of centimeters. These antenna systems may, in particular, be so-called body coils. The antenna elements of the body coil may be constructed on a support tube that cylindrically encloses a measurement space of the magnetic resonance imaging system (the so-called patient tunnel).

If the antenna systems are mechanically coupled to parts of the magnetic resonance imaging system, the antenna systems will be excited in oscillations during operation of the magnetic resonance imaging system by the vibrations that occur during operation. These oscillations are perceptible in various ways. On the one hand, this may entail influences on the quality of the imaging, or the patient's specific absorption rate (SAR), and on the other hand the antenna systems set in oscillation themselves also emit sound that may possibly be perceived as unpleasant by a patient.

SUMMARY AND DESCRIPTION

The scope of the present invention is defined solely by the appended claims and is not affected to any degree by the statements within this summary. The present embodiments may obviate one or more of the drawbacks or limitations in the related art.

Oscillations of the antenna system are perturbing, in particular, when the oscillations cause interactions in a frequency range critical for the imaging or the patient comfort during operation of the magnetic resonance imaging system. The critical frequency range may in this case include, or be formed by, one or more frequency sections, possibly separated from one another. The critical frequency range, that is to say the frequency section or sections that are to be assessed as critical in respect of particular criteria, (e.g., image quality or noise generation), may be established, calculated or empirically determined before or during the construction of a magnetic resonance imaging system.

The critical frequency range may, for example, include frequencies at which natural oscillations of an examination object to be imaged by the magnetic resonance imaging system may be excited. The excitation of the natural frequencies of the examination object may take place by structure-borne noise. That is to say, for example, an examination object located on a patient table is set directly by mechanical vibrations of the magnetic resonance imaging system, e.g., periodic or aperiodic oscillations, likewise in vibration. The critical frequency range may in particular include cardiac frequencies, frequencies of natural mechanical oscillations of other organs, for example, the liver, the kidney, the lung, in particular respiratory rates, natural oscillations of cerebral fluids in a liquor system or similar natural frequencies of the patient, or of the examination object. These natural frequencies include, in particular, frequencies in a frequency range of between 5 Hz and 200 Hz.

A further section that may form part of the critical frequency range relates to frequencies in which artifacts occur in the imaging by the MR system, for example, moiré effects that result from the superposition of the position encoding frequency with the vibration frequency. These frequencies may be dependent on the spatial resolution or in another way on a magnetic resonance recording to be carried out. In order to establish the critical frequency range, for example, conventional drive sequences may be studied empirically or computationally in respect of their effect on the quality of the imaging in a particular MR system (that is to say, in particular, the occurrence of artifacts). On the basis of this study, frequencies are determined at which artifacts occur with a probability that lies above a predetermined minimum probability, and which are consequently associated with the critical frequency range. The minimum probability may, for example, be 80% or more. For example, the critical frequency range may include frequencies between 5 Hz and 20 kHz.

Furthermore, a section of the critical frequency range may include frequencies of acoustically perturbing sound waves. This may involve the aforementioned structure-borne noise, but also indirectly propagated sound that, for example, is transmitted by air oscillations. Sound waves are acoustically perturbing when, for example, a particular volume is exceeded and/or the sound includes frequencies that are perceived as unpleasant, for example, the monotonous frequency of a dental drill. These frequencies may also be studied empirically or computationally. On the basis of this study, frequencies are determined at which, during operation of the magnetic resonance imaging system, a particular maximum volume is exceeded and/or which are perceived as perturbing, and are consequently associated with the critical frequency range. These frequencies may be in the range of between 20 Hz and 20 kHz, and the maximum volume is, for example, up to 90 dB, or up to 99 dB, at the location of the examination object with hearing protection.

The antenna system may in particular be mechanically coupled by a suspension system to a support structure, for example, a gradient coil or a patient table of the scanner. Accordingly, the critical frequency range may in particular include natural frequencies of the support structure and/or of other components of the magnetic resonance imaging system.

The critical frequency range may, in particular, also be determined in such a way that the range only includes frequencies, in particular of mechanical oscillations of the antenna system, which may be excited during operation of the magnetic resonance scanner, e.g., that are relevant. That is to say, energy transmission to these oscillation modes of the antenna system is possible during operation of the scanner.

The embodiments are based on the concept that an antenna system may be configured and/or operated in such a way that the antenna system does not contribute, or contributes to a small extent, to the described interactions in the critical frequency range.

The magnetic resonance scanner for recording raw magnetic resonance data therefore includes an antenna system, (e.g., a body coil), that has an adjustment device for setting, or modifying, the natural frequency of a natural mechanical oscillation mode of the antenna system.

The modification of said natural oscillation mode with the associated natural frequency may, in particular, be expedient when the natural frequency of the antenna system, without the adjustment device, would lie within the critical frequency range. It may also be expedient to modify the natural frequency when, in an initial setting of the adjustment device, the natural frequency would lie in the critical frequency range.

With the aid of the embodiments described herein, and in particular the adjustment device, it is possible to set an antenna system, or its natural oscillation modes, and operate the system in such a way that during operation the system has natural frequencies that are non-critical for the imaging or the patient comfort. The natural frequency of the antenna system, modified or set with the aid of the adjustment device, lies outside the critical frequency range. The vibrations result from excitation frequencies of the gradient coil and may be transmitted to the body coil, or the antenna system, in two different approaches.

In a first approach, the resonant frequency of the gradient coil is transmitted to a base-field magnet and from there to the mounting of the body coil, and from the mounting to a support tube of the body coil.

In a second approach, excitation by sound is transmitted through the surface structure. The gradient coil pulsates with a certain working frequency, so that the surrounding air is set in oscillation. Via the air gap between the body coil and the gradient coil, the resulting sound waves excite the body coil in oscillation.

The two excitation variants have a different weighting at different frequencies. In the low-frequency range, the transmission component of the rigid body excitation dominates. In the high-frequency range, the sound wave transmission component dominates. The excitation mode of the body coil is given by the sum of the individual excitation influences.

Thus, a resonance shift of an individual principal mode that lies outside the MR-perturbing range, e.g., the critical frequency range, may readily occur. Likewise, it is conceivable to subdivide the perturbing resonance into a plurality of individual modes.

In certain embodiments, it is permissible for the antenna system to vibrate so long as no negative effects occur with respect to the imaging or the patient comfort.

This offers the advantage that the outlay for shifting the natural frequency of the antenna system may be significantly less than, for example, the outlay for damping the excitation of a multiplicity of or all natural oscillation modes of the antenna system.

The adjustment device may, in particular, be formed in order to shift the natural frequency by a predetermined differential frequency, e.g., a frequency value by which a natural frequency is shifted is specified. In this case, the shift may in particular be carried out in such a way that the natural frequency is shifted outside the critical frequency range by the adjustment device.

A shift of a natural frequency may be achieved by modifying a characteristic length of the antenna system. For example, this is a length of a region of the antenna system, which has uniform damping properties with respect to the oscillation mode in question, e.g., it is in one piece (that is to say made of one material) and may have an identical geometrical shape over said length.

According to the embodiments, a magnetic resonance imaging system that includes such a magnetic resonance scanner is furthermore provided. The magnetic resonance imaging system may additionally have a main control instrument, with the aid of which the operation of the magnetic resonance scanner for recoding magnetic resonance data may be controlled and/or regulated.

A method for setting a natural frequency of an antenna system, in particular a body coil, includes an adjustment device for modifying the natural frequency of a natural mechanical oscillation mode of the antenna system. The method includes the following acts.

In one act, the method includes determining a natural mechanical frequency spectrum of the antenna system. The determination may be carried out without the adjustment device and may, for example, thus be carried out during the construction of the antenna system, before the adjustment device is installed. Likewise, it is conceivable for the determination of the natural frequency spectrum of the antenna system to be carried out in a starting setting in particular, an instantaneous starting setting, of the adjustment device.

In a subsequent act, a differential frequency by which a determined natural frequency of the natural frequency spectrum needs to be shifted, in order to achieve an improvement in the image quality of the magnetic resonance imaging system and/or in the patient comfort, is determined. To this end, as described above, a critical frequency range may be established, that is to say the frequency sections out of which the natural frequency may be shifted so as to achieve an improvement in the image quality, or in the patient comfort.

In a further act, the adjustment device is set so that the natural frequency is shifted by the determined differential frequency.

The embodiments furthermore relate to methods for operating a magnetic resonance imaging system having a magnetic resonance scanner including an antenna system, wherein a natural frequency of a natural mechanical oscillation mode of the antenna system is controlled and/or regulated, (e.g., shifted), in the magnetic resonance scanner.

The adjustment device may be made of a non-metallic material. The influence of the adjustment device on the image quality as a result of electrical interaction may therefore be kept to a minimum.

In particular, the adjustment device may be formed in order to make it possible to shift a plurality of natural frequencies that occur with respect to different oscillation planes of the antenna system. The antenna system may also include a plurality of adjustment devices, or an adjustment device having a plurality of adjustment units, which make this possible in combination. To this end, for example, various differential frequencies may be specified with respect to different oscillation planes of natural oscillation modes.

In one refinement, the adjustment device includes a spring element, which may include an arrangement of one or more leaf springs, spring rings, coil springs or the like. The spring elements may cause a shift of a natural frequency of the antenna system. The adjustment device may also include a plurality of spring elements that make it possible to shift a plurality of different natural frequencies of the antenna system, which may occur with respect to different oscillation planes of the antenna system. Spring elements may include components of aluminum oxide, beryllium/copper alloy, fiber composites (e.g., glass fibers or carbon fibers), para-aramid synthetic fibers (e.g., Kevlar), high molecular weight polyethylene, or rubber, or are formed from one or more of these materials.

The antenna system may include a support element that carries an antenna element of the antenna system directly or indirectly. For example, the support element may be a support tube of a body coil. The adjustment device may be part of this support element or, for example, mechanically coupled to the support element in another way. The support element may establish a natural oscillation mode of the antenna system since the support element may make the greatest contribution to the mechanical stability of the antenna system.

In this case, the adjustment device may be functionally coupled to the support element, or integrated into the support element, in such a way that the effect of the support element on the frequency of the natural oscillation modes of the antenna system may be influenced.

An example of an adjustment device that may be integrated into the support element is a spring element that is integrated into the support tube of a body coil. Alternatively, it is also conceivable for the spring element to be adhesively bonded onto the support tube or screwed to the support tube, or connected to the support tube in another way, in particular reversibly releasably. This has the advantage that rapid adaptation of the adjustment device to different requirements with respect to the critical frequency range may be carried out.

In particular, the adjustment device may include a stress device that may apply a mechanical stress to the support element of the antenna system. The stress device may be integrated into the support element or mechanically coupled to the support element in another way. It is also conceivable for the stress device to be connected reversibly releasably to the support element, so that the described advantages may also be achieved with a stress device.

For example, the stress device may include a cable and/or a cord that may in particular respectively be coupled to the support tube of the body coil. The stress device may engage at least locally around the support element and, in the engaged section, induce a mechanical stress, e.g., extension, compression, pressure, in particular flexion, but also torsion or shear. This provides, for example, that the action of force on the support element may be described by a modulus of elasticity of the support element. It is therefore possible to shift natural frequencies in a controlled way.

The adjustment device may be formed in such a way that the adjustment device may be driven during operation of the scanner. This provides that a user or an operator of the magnetic resonance scanner may (via a user interface) establish whether and/or how (e.g., with respect to which oscillation plane or which natural oscillation mode) and by which differential frequency a shift of the natural frequency may be carried out.

An iterative method may be used in order to establish the critical frequency range and/or the shift of the natural frequency. The establishment of the critical frequency range, as described in the introduction, may in this case also be carried out during operation of the magnetic resonance imaging system, e.g., while there is a patient on the aforementioned patient table. In this case, the adjustment device may be mechanically connected to the antenna system during the determination of the critical frequency range.

In the method, for example, a test recording may initially be carried out with the aid of the magnetic resonance imaging system and a modification or shift of the natural frequency and/or the determination of the critical frequency range may subsequently be established on the basis of the test recording, e.g., in particular on the basis of the MR image data obtained in this way. Advantageously, moiré effects that occur during a recording may thus be determined. These moiré effects may be avoided by establishing the critical frequency range in such a way that the range includes those frequencies that contribute to the occurrence of the moiré effect. In the same way, natural frequencies of the examination object may also be determined by test recordings, or with MR image data, and taken into account in the critical frequency range.

In certain embodiments, the adjustment device may be formed in order to modify the differential frequency reversibly. That is to say, the generation of the differential frequency may be cancelled, e.g., may be switched off.

Furthermore, a shift of the differential frequency may, for example, also be carried out in a plurality of acts. In particular, the adjustment device may be formed in order to carry out a shift by a differential frequency that may be selected from a multiplicity of different predetermined differential frequencies. The differential frequency may in this case also be selected from a continuous frequency interval.

Besides the shifting of the natural frequency, it may furthermore also be advantageous for the adjustment device to include a damping element that is formed in order to absorb oscillation energy of a natural oscillation mode. This provides, in particular, that oscillation energy of the natural oscillation mode may be converted into heat. The damping may take place with respect to an established natural frequency that may be the same as a natural frequency that has been shifted.

Furthermore, the damping or the damping element may however also be adjustable, e.g., the damping that is exerted by the damping element may be adjusted with respect to different frequencies during operation of the magnetic resonance imaging system. In particular, the aforementioned adjustment devices may already have damping properties, or form the damping element. That is to say the cords, cables or springs may be formed in order to damp a natural frequency and/or the cords, cables, or springs may be adjustable in their damping properties.

In order furthermore to increase the patient comfort, the adjustment device may be formed, or adjustable, in such a way that the oscillation spectrum of the antenna system predominantly includes even harmonics of a natural oscillation. That is to say predominantly even harmonics of a natural frequency of the antenna system may still be excited. In this case, "predominantly" provides that the frequency spectrum includes more even harmonics than odd harmonics of the natural oscillation, as is the case, for example, in the Fourier spectrum of an oscillation of a membrane that has been excited with a force profile that is triangular as a function of time, or a "triangle pulse". In contrast thereto, the Fourier spectrum of an oscillation of a membrane that is excited "suddenly", e.g., with a force profile that is rectangular as a function of time, or a "square-wave pulse", would predominantly include odd harmonics. In this case, an equal excitation energy as a function of frequency in the oscillation spectrum is assumed. The equal excitation energy may be achieved by carrying out the damping with respect to the odd harmonics with the aid of damping elements that in particular may be formed by the adjustment device. Furthermore, it is however also conceivable for the antenna system to include further damping elements that are likewise adjustable with respect to their damping properties in such a way that even harmonics of a natural oscillation are predominantly excited. In this way, "pleasant noise generation" or emission by the antenna system may be achieved for the patient.

The magnetic resonance scanner may include a support structure, for example, the gradient coil of the magnetic resonance imaging system, to which the antenna system is mechanically coupled by a suspension system.

The suspension system may have a drivable setting mechanism, in order to reversibly set a coupling parameter value of the mechanical coupling between the antenna system and the support structure and/or a relative position of the antenna system with respect to the support structure.

The setting may be carried out during operation of the magnetic resonance imaging system. The overall system including the antenna system, suspension system and support structure may be described as a model as a system of two coupled pendulums. The adjustment device is in this case used in the model in order to establish the length of one of the pendulums, which is formed by the antenna system in this case. The suspension system establishes the spring constant of the coupling to the other pendulum in the model. The other pendulum is in reality formed by the other components of the scanner, or of the magnetic resonance imaging system, e.g., in the form of the support structure. It is therefore possible to modify the energy transmission to the antenna system by varying the natural frequencies of the coupled system, in particular by varying a coupling parameter value and/or by varying the natural frequency of the antenna system. By setting the coupling parameter value, it is also possible to establish, or modify, a natural frequency of the coupled system including the antenna system, suspension system and support structure.

Furthermore, in this way, as explained below, a position correction may also be carried out in order to set or keep constant a preferred location or position of the antenna system with respect to the support structure.

In this case, the described configurations for the establishment of a critical frequency range of the antenna system may also be applied to the establishment of a critical frequency range of the system, including the antenna system, suspension system and support structure, described as a model by coupled pendulums.

Overall, it is therefore possible to produce an advantageously adjustable system that offers several possibilities for minimizing the energy transmission to the antenna system. It is therefore also possible to simultaneously find an advantageous setting with respect to the patient comfort, e.g., the sound exposure and the frequencies of the mechanical oscillations that occur.

In one refinement, the magnetic resonance imaging system may include a differential frequency control device that is formed in order to control and/or regulate a differential frequency for shifting a natural frequency of the antenna system. That is to say, the setting or shifting of the natural frequency of the antenna system may in particular be carried out during operation, e.g., while there is an examination object in the magnetic resonance scanner.

Furthermore, it is also conceivable for the magnetic resonance imaging system to have a suspension control device that is formed in order to control and/or regulate the modification of the coupling parameter value or the position of the antenna system relative to the support structure. The differential frequency control device may also be coupled to the suspension control device, or integrated therein.

In particular, the differential frequency control device and/or the suspension control device may be part of the aforementioned main control instrument of the magnetic resonance imaging system, which controls and/or regulates the acquisition of magnetic resonance data.

The differential frequency control device and/or the suspension control device may, for example, involve so-called "feed-forward control and/or feed-forward regulation." That is to say, the control and/or the regulation may be based on a prediction of possible vibrations or impairments of the patient comfort. To this end, for example, future drive parameters of the magnetic resonance imaging system for generating a magnetic resonance image, (e.g., gradient control parameters and/or RF control parameters), may be taken into account in the control and/or the regulation.

In particular, the control may take place "online". In this case, "online" provides that sections of a drive sequence, (e.g., drive sequence data), are recorded while raw magnetic resonance data are being recorded by the MR system, and their effect on oscillations of the antenna system are predicted, (e.g., estimated and/or calculated).

The prediction for the "feed-forward control and/or regulation" may, for example, in this case be carried out by an expert system that is formed in order to predict which frequencies are to be assigned to the critical frequency range, for example, on the basis of the patient data (e.g., individually for the patient), in particular the measurement to be carried out or future drive sequence data, as well as a number of predetermined parameters of the magnetic resonance imaging system, for example, the parameters associated with the aforementioned drive sequence data. The expert system is, in particular, formed in order to estimate or predict the aforementioned frequency ranges that the critical frequency range may comprise.

The expert system may furthermore be formed in order to predict a natural oscillation spectrum or vibration spectrum of the antenna system, to be expected or occurring during operation, e.g., on the basis of the drive sequence data.

The expert system may furthermore be formed in order to determine the differential frequency and/or the coupling parameter value in such a way that a natural frequency of the antenna system or of the coupled system, including the antenna system, suspension system and support structure, lies outside the predicted critical frequency range. This may be done with the aid of a comparison between the critical frequency range and the natural oscillation spectrum. The comparison may be carried out in such a way that natural frequencies that lie in the critical frequency range are determined on the basis of the natural oscillation spectrum. Subsequently, for a natural frequency, and, in certain embodiments, for each natural frequency, which lies in the critical frequency range, a differential frequency and/or a coupling parameter value is determined that is suitable for shifting the natural frequency lying in the critical frequency range out of the critical frequency range.

The differential frequency control device, or the expert system, may also be connected to sensors that may record the natural oscillations of the examination object. For example, these sensors may be an ECG device, a respiratory sensor or respiratory belt, or similar sensors that may determine biological quantities influencing the critical frequency range, for example, the frequency of the occurrence of a so-called R wave in an ECG signal or the respiratory rate. Furthermore, with the aid of MR images, it is also possible to determine a natural frequency of the examination object, for example, a natural frequency of ventricles that are filled with cerebrospinal liquor, which is taken into account in the critical frequency range. To this end, the differential frequency control device may be connected to a reconstruction unit for magnetic resonance image data and be formed in order to determine characteristic natural frequencies of the examination object with the aid of image data. In the same way, it is also possible to record image artifacts, for example, moiré effects. The natural frequencies of the examination object and/or the frequencies of the image artifacts may be taken into account in the critical frequency range.

This also provides, in particular, that weight data of the examination object, which is to be imaged at least partially with the magnetic resonance imaging system, may be taken into account when determining or predicting the natural frequency spectrum of the examination object, or when establishing or predicting the differential frequency.

Furthermore, the expert system, or the differential frequency control device, and/or the suspension control device may be formed so as to be capable of learning. That is to say, an MR measurement, in particular a test measurement, may be analyzed automatically with respect to the occurrence of critical frequencies, and a shift of natural frequencies may be carried out automatically in such a way that the critical frequencies determined no longer occur in a rerun of the MR measurement or a measurement with similar constraints. In this case, both the recorded MR image data and the measurement values of the aforementioned sensors may be taken into account. There may be a possibility for an operator of the MR system to intervene, in order to modify or confirm the proposed automatic changes. This may, for example, be done with the aid of a user interface of the MR system, the expert system, or the differential frequency control device, and/or the suspension control device.

The force for setting the adjustment device and/or the setting mechanism may be generated pneumatically, hydraulically, piezoelectrically, and/or magnetostrictively.

BRIEF DESCRIPTION OF THE DRAWINGS

FIG. 1 depicts an embodiment of an adjustment device in the form of a ladder-like arrangement of leaf spring elements.

FIG. 2 depicts an embodiment of a number of adjustment devices similar to FIG. 1, which are integrated into a support tube of a body coil.

DETAILED DESCRIPTION

Figure 3:
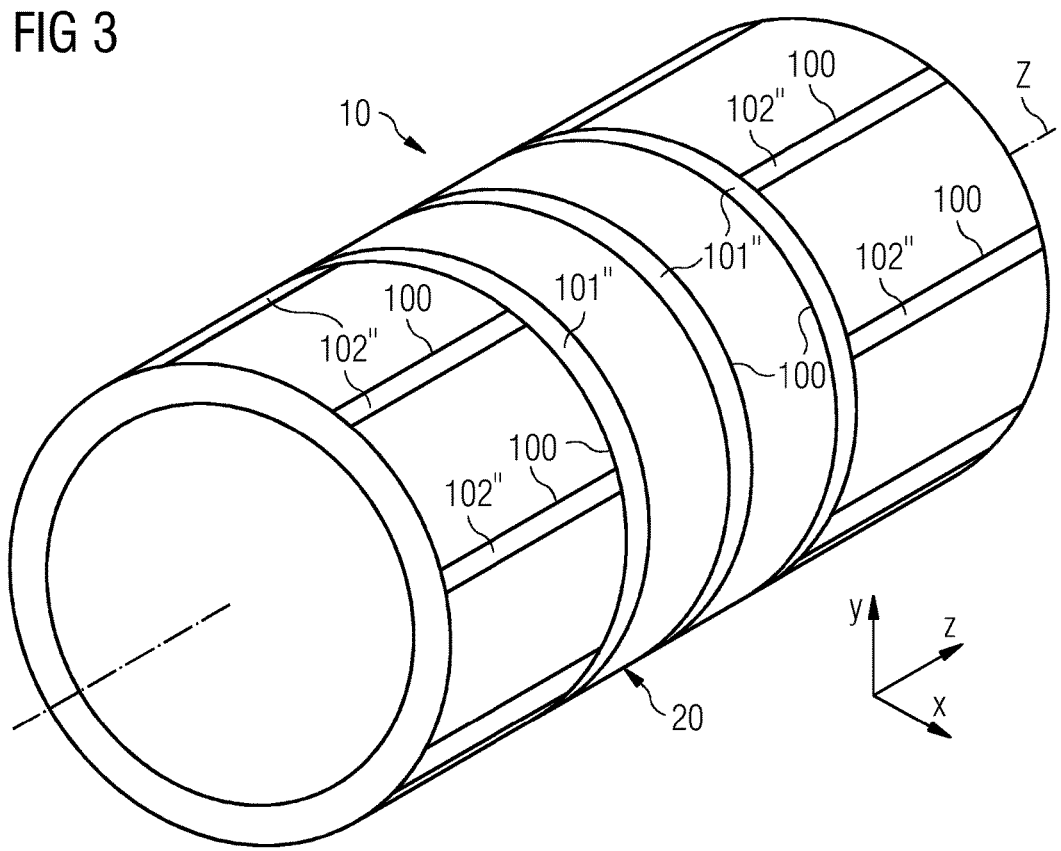
FIG. 3 depicts another exemplary embodiment of a support tube of a body coil, which is connected to leaf spring elements.

FIG. 1 depicts one embodiment of an adjustment device 100 that may be built into an antenna system. The adjustment device 100 is an arrangement of leaf springs, or rod springs, which include a plurality of leaf spring elements 101, 102, or spring elements.

Instead of the leaf spring elements 101, 102, it is also possible to use round rods or square rods. These spring elements may also be laminated in a composite structure, for example, wound tubes, and in particular the spring elements may be wound directly into a laminate, or a glass fabric (e.g., fully enclosed by the fabric of the glass structure, in particular a glass fiber fabric). The spring elements may also be cast into a glass fabric. The spring element may include or be a "bimetallic" element, (e.g., a combination of metals having different coefficients of thermal expansion), with which a force may actively be generated, for example, by local heating by a heating element.

The leaf spring elements 101, 102 are connected to one another in a ladder-like fashion, (e.g., two leaf spring elements extending mutually parallel), the main spring elements 101 of the ladder-like arrangement, are connected to a plurality of leaf spring elements 102 arranged transversely thereto. The transversely arranged leaf spring elements, (e.g., the rung spring elements 102 of the ladder-like arrangement), likewise extend mutually parallel and are equally separated from the neighboring rung spring element 102, which is arranged parallel. The combination of a plurality of leaf spring elements 101, 102, which includes at least two leaf spring elements 101, 102 that extend in different spatial directions to one another, is formed in order to influence a multiplicity of different oscillation planes. That is to say, the natural frequencies of a plurality of different natural oscillation modes, which may also have different oscillation planes to one another, with a suitable arrangement, may be varied with the aid of the adjustment device 100.

FIG. 2 depicts this by way of example with reference to a plurality of adjustment devices 100 according to FIG. 1, or refinements thereof, which an antenna system 10 of a magnetic resonance imaging system includes. The antenna system 10 is a body coil, which encloses a patient tunnel of the associated magnetic resonance imaging system. A patient table, which may be displaced in the z direction, may be arranged in the patient tunnel. The z direction in this case conventionally coincides with the direction of the base magnetic field, mentioned in the introduction, of the magnetic resonance imaging system. The body coil 10 has a plurality of antenna elements 15 that are connected to a support element 20, which is formed as a cylindrical support tube 20. The longitudinal axis of the support tube 20 extends in this case in the z direction. In this exemplary embodiment, the support tube 20 includes a relatively thin, about 10 to 20 mm thick, shell of glass fiber-reinforced epoxy resin. The antenna elements 15 may be formed in this case as metal bars or as plates, and are adhesively bonded onto the support tube or screwed to the support tube 20 by suitable holders, or cast or firmly connected to the support tube 20.

The support tube 20 is subdivided by a plurality of adjustment devices 100A, 100B, 100C according to FIG. 1 into a plurality of support tube sections 20A, 20B. The arrangement may be obtained by respectively forming a plurality of windows that are arranged in the lateral surface of the support tube 20, and into which the adjustment devices 100A, 100B, 100C are placed flush so that the circumferential surfaces of the respective window cutouts are connected to the adjustment device 100A, 100B, 100C. The adjustment devices 100A, 100B, 100C complete the lateral surface of the support tube 20 in the region of the window cutout. To this extent, the adjustment devices 100A, 100B, 100C may also be regarded as integrated into the support tube 20. For example, the adjustment devices 100A, 100B, 100C may be adhesively bonded, screwed or cast with the support tube 20, (e.g., firmly connected to the support tube 20), or connected to the support tube 20 in another way, in particular, reversibly releasably connected.

The adjustment devices 100A, 100B, 100C are made of a different material than the other support tube sections 20A, 20B, which are made in particular of epoxide. Subdivision of the support tube 20 is in this case carried out in such a way that the epoxide tube is fully divided into two cylindrical support tube sections 20A, 20B in the direction of the longitudinal axis of the support tube 20, e.g., in the z direction. The support tube sections 20A, 20B are approximately of equal length in the z direction. The adjustment device 100A is fitted into the resulting window fully dividing the lateral surface approximately centrally in the z-axis direction. The adjustment device 100A extends over the entire circumference of the support tube 20, transversely with respect to the z direction, and is a refinement of the adjustment device 100 according to FIG. 1. Unlike the adjustment device 100 according to FIG. 1, the two main spring elements 101', extending parallel, are now formed as spring rings 101' arranged mutually parallel, concentrically and at a distance from one another, which follow the cross section of the support tube 20 transversely with respect to the z direction and, as described, cause division of the support tube 20 in the z direction into two sections 20A, 20B essentially made of epoxide. The support tube is therefore not formed continuously from one material over its entire length in the z direction. The ladder-like arrangement of leaf springs according to FIG. 1 is nevertheless substantially adopted in this case; rung spring elements 102' arranged mutually parallel and parallel to the z direction, and equally separated, connect the two spring rings 101' and therefore the support tube sections 20A, 20B that are formed, each of which includes one of the spring rings 101' on one end. The adjustment device 100A shifts the frequency of a natural oscillation mode, which includes an oscillation in an oscillation plane extending in the direction of advance z, by a differential frequency. The differential frequency is, in particular, established by the length of the support tube sections 20A, 20B in the z direction and the coupling of the leaf spring elements 101', 102' to one another, that is to say in particular also by the length of the rung spring elements 102' extending in the z direction, e.g., by the spacing of the main spring elements 101'.

The adjustment device 100A is in this case also formed in order to shift the natural frequency of natural oscillation modes of the body coil 10 that have an oscillation plane transverse to the z direction. The differential frequency may in this case also be established, in particular, by the mutual spacing of the rung spring elements 102' extending parallel to the z direction, e.g., by the subdivision of the support tube 20 in the circumferential direction into characteristic lengths with the aid of the rung spring elements 102'.

Alternatively, it is also conceivable for the support tube 20 to include a plurality of the adjustment devices 100A, which subdivide the support tube 20 along the z direction into more than two support tube sections 20A, 20B.

In the exemplary embodiment represented in FIG. 2, the body coil 10 furthermore includes other adjustment devices 100B, 100C, which also essentially correspond to the ladder-like adjustment device 100 according to the exemplary embodiment of FIG. 1. These devices are respectively arranged in different support tube sections 20A, 20B resulting from the subdivision by the adjustment device 100A. The adjustment device 100B is in this case a ladder-like spring arrangement according to FIG. 1, the two main spring elements 101' being arranged parallel to the z axis. The arrangement of the adjustment device 100C differs in that its main spring elements 101' extend in the circumferential direction. The two adjustment devices 100B, 100C are fitted into matching window cutouts of the support tube sections 20A, 20B, which subdivide the support tube sections 20A, 20B only partially in the circumferential direction, e.g., not fully in contrast to the adjustment device 100A. The adjustment devices 100B and 100C are produced in one piece.

A characteristic length in the circumferential direction is also thereby established, so that a multiplicity of different natural frequencies may be shifted with the aid of an individual ladder-like adjustment device 100A, 100B, 100C.

In this case, natural oscillation modes are in turn modified in their natural frequency by the adjustment devices 100B and 100C in such a way that the frequencies lie outside the aforementioned critical frequency range.

The adjustment devices 100B, 100C are fastened on the epoxide parts of the support tube sections 20A, 20B in the same way as the adjustment device 100A.

It is also conceivable for one or all of the adjustment devices 100A, 100B, 100C to be connected to the outer lateral surface of the epoxide section of the support tube 20. In particular, in this case the adjustment devices 100A, 100B, 100C may be fitted reversibly releasably to the support tube 20, for example, screwed or clamped between two holders.

FIG. 3 depicts an alternative embodiment, in which individual leaf spring elements respectively subdivide the support tube 20 of the body coil 10 in turn into a plurality of characteristic lengths. In this case, in end sections of the cylindrical body coil, that is to say in sections that include the opening of the body coil, the leaf spring elements are integrated into the support tube 20, for example, embedded or fully cast into the epoxide material, in such a way that the material is subdivided in the circumferential direction into a plurality of sections having characteristic lengths. The leaf spring elements, that is to say the adjustment devices 100, are in this case directly embedded individually into the epoxide material of the support tube 20, so that the leaf spring elements are accessible via the lateral surface of the support tube. For example, matching grooves for receiving the leaf spring elements may be ground, or introduced in another way, into the epoxide section of the support tube, these grooves not forming a complete opening of the lateral surface of the support tube 20, in contrast to the windows.

It is also conceivable for the leaf spring elements, or the adjustment device 100, to be placed on a uniformly extending section of the epoxide surface of the support tube 20.

In a central region of the support tube 20, other adjustment devices 100 are in turn arranged in the form of spring rings 100" extending in the circumferential direction of the support tube 20, which causes subdivision of the support tube 20 into characteristic lengths in the z direction. By this combination of spring rings or spring elements 101", 102" that differ in respect of their orientation and shape, natural frequencies of a multiplicity of natural oscillation modes may in turn be shifted in such a way that the frequencies lie outside the critical frequency range, e.g., by a defined differential frequency.

Alternatively, the described spring rings or spring elements 101", 102" in this exemplary embodiment may be formed by cables or cords, which may in particular be formed elastically.

Figure 4:
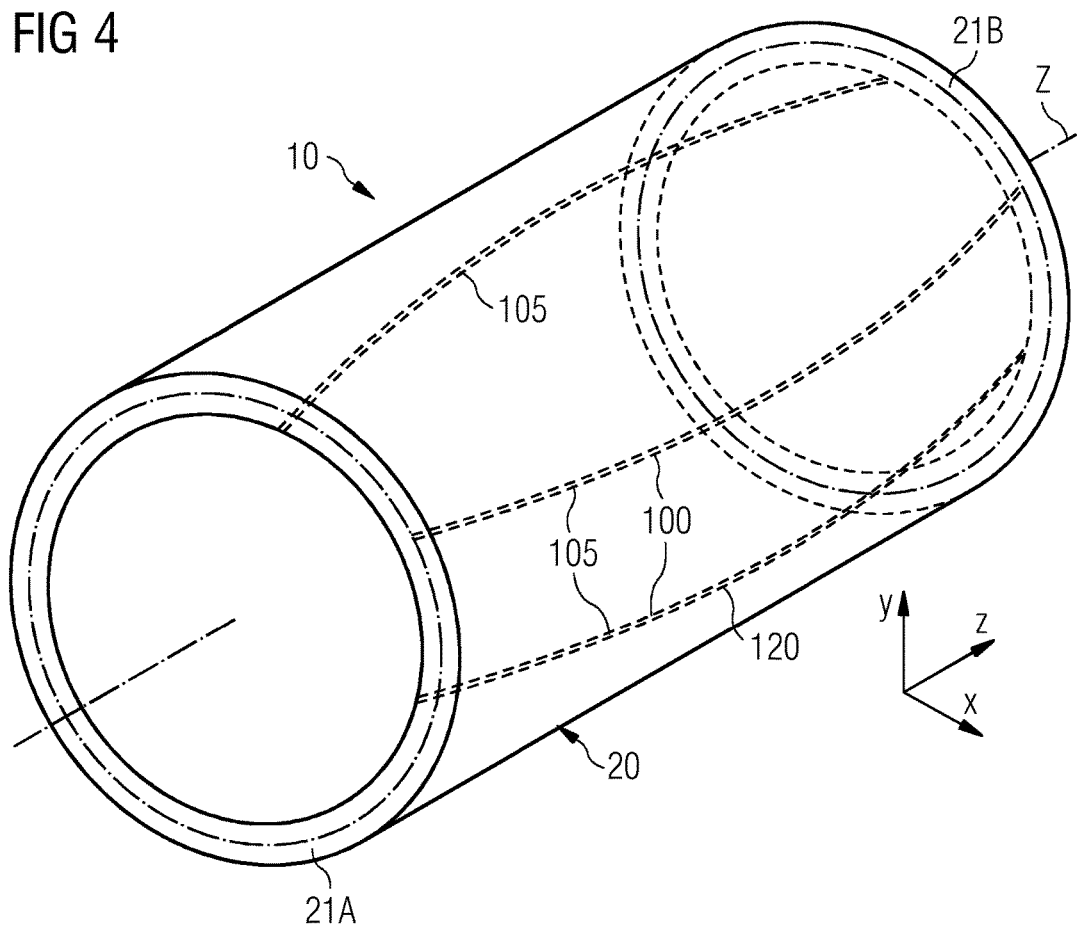
FIG. 4 depicts an exemplary embodiment of a cylindrical support tube of the body coil, a plurality of adjustment devices extending over the entire length of the cylinder, in the form of stress and strain elements, which are respectively connected at the cylinder ends to the support tube.

FIG. 4 depicts another exemplary embodiment. In a similar way to the individual leaf spring elements of FIG. 3, the body coil 10 includes an adjustment device 100 having a narrow flexible cord element 105, which is respectively connected to opposite end faces 21A, 21B of the support tube 20. The end faces 21 respectively form a ring of a epoxide material, the radius of which is 10 to 20 mm greater than the radius of a circular opening hole for a cylindrical patient tunnel, with which the support tube 20 is concentrically arranged. The cord element 105 extends essentially parallel to the z direction and is connected to the respectively opposite end face 21A, 21B of the support tube 20, for example, adhesively bonded, screwed or clamped between the end faces 21A, 21B, so that a form-fit connection to the end faces 21A, 21B is formed. As may be seen, the adjustment device 100 includes a plurality of cord elements 105.

Alternatively, in the exemplary embodiment, the cord element 105 may also be replaced by a leaf spring element and/or a stressing cable.

The cord elements 105 may be formed from polyester, polyamide, high molecular weight polyethylene (e.g., Spectra) or Kevlar, or include these materials. It is also possible to employ metal strings, such as are used in musical instrument manufacture. Materials, from which the leaf spring elements are formed or which the leaf spring elements comprise, may be beryllium/copper alloys, laminar fiber composites (e.g., carbon fibers or fiberglass), multilayer bonded wood elements, or ferromagnetic spring elements having low magnetic properties. This indicates, for example, that the cord elements have a geometrical shape, (e.g., a cord diameter), which keeps the formation of magnetic clusters small. The diameter therefore may lie in a range of less than 5 mm. In particular, the cord elements or leaf spring elements may be formed from a nonconductive material.

The cord elements or leaf spring elements or stressing cables are connected with a pre-stress to the support tube 20. That is to say, the profile "essentially parallel to z" defines, in this case, that the cord elements or leaf spring elements may also have a deflection in a spatial direction transverse to the z direction in their profile, albeit one that is less than half the element length in the z direction.

In the case of the cord elements 105, to this end an additional stress element that permits this deflection is needed. For example, the cord element 105 may have a further point of connection to the support tube 20 in its profile, making it possible to specify a cord tension, e.g., to set the deflection relative to the z axis.

In this exemplary embodiment, a shift of the frequency of natural oscillation modes also takes place in particular in the x/y plane, which extends transversely to the z direction.

The support tube 20 is in this case subdivided in the circumferential direction, that is to say transversely to the z direction, by the multiplicity of adjustment devices 100 or cord elements 105 into a plurality of characteristic lengths, so that a shift of the natural frequency of natural oscillation modes, the oscillation plane of which lies in the x/y plane, again takes place. By virtue of the arrangement depicted, natural oscillations whose oscillation plane contains the z direction, on the other hand, are mainly damped, although this may also be associated with the shift of a natural frequency of the antenna system.

To this extent, the cord elements 105 or leaf spring elements simultaneously form the damping elements 120. Moreover, the spring elements of the exemplary embodiments of FIGS. 1 to 3 also have damping properties.

The exemplary embodiments of FIGS. 1 to 4, as described above, respectively depict possibilities of achieving a static shift of the natural frequency of a natural oscillation mode by a predetermined differential frequency by design or structural measures being carried out beforehand. To this end, the critical frequency range may, for example, have been established or determined during the construction of the magnetic resonance imaging system, for example, as described above.

In this case, it is to be taken into account that the weight of a patient supported on a patient table in the magnetic resonance imaging system, or MR system, influences the necessary shift of the natural frequency of the antenna system either directly or indirectly. On the one hand, when the antenna system is connected to the patient table, a natural frequency of the antenna system may already be shifted so that another differential frequency results therefrom.

The differential frequency, by which the shift of the natural frequency of a natural oscillation mode is carried out, may be established in such a way that there is a safety frequency distance of the shifted natural frequency from the critical frequency range. The considerations described in the introduction regarding the establishment of the critical frequency range may, for example, be carried out not individually for the patient. For example, a standard patient may be used, variation ranges of parameters of the standard patient may be determined, and the shift of the natural frequency may be established on the basis of the variation ranges of the safety distance.

On the other hand, the natural frequencies of the other components of the magnetic resonance imaging system, or a combination of components of the MR system, in particular a combination of the antenna system with the aforementioned support structure of the antenna system, may be influenced. In this case, and as a consequence of the patient weight, the critical frequency range may also change. This likewise has the consequence that the predetermined differential frequency would need to be changed. This consideration may also be taken into account in the safety frequency distance.

In any purely static establishment of the natural frequencies, there is a particular difficulty in finding a suitable prediction or establishment of the critical frequency range in which frequency ranges, in which vibrations of the antenna system are permissible, are still free. Therefore, it is not necessary to damp the entire oscillation spectrum of the antenna system. Non-critical frequency ranges may be predicted or determined in a much better way if the prediction may be carried out individually for the patient. In the case of an individual prediction for the patient, the critical frequency ranges may be estimated or calculated more accurately, and therefore more narrowly.

It may therefore be advantageous if the shift of the frequency of a natural oscillation mode is not carried out statically, but may be set during operation of the magnetic resonance system.

Individual predictions for patients of the critical frequency range may be made, and a suitable individual setting for the patient of natural frequencies may be carried out dynamically.

This is possible, for example, with minor modifications for the exemplary embodiments of FIGS. 1 to 4.

In the embodiment of FIG. 4, each face of the annular end faces 21A, 21B may in particular be rotatable about the z axis, so that the cord element or leaf spring element is respectively connected on the end to a rotatable ring (e.g., respectively to one of the end faces). With the aid of the two rings assigned to the respective cord element or leaf spring element, it is possible to adjust the position and end points of the cords or springs over the profile of the circumferential line of the cylinder opening of the support tube 20. If there are a plurality of cord elements 105 or spring elements, as represented in FIG. 4, and these cord elements are respectively connected on the end to different rings 21A, 21B, adjustment of the end points of the cord elements 105 or leaf spring elements, in particular relative to one another, is possible in the circumferential direction of the support tube 20. In this way, the subdivision of the circumference of the support tube 20 into a plurality of characteristic lengths may be adapted and modified during operation of the magnetic resonance imaging system. This makes it possible to adapt the shift of the frequency of the natural oscillation mode that has a vibration plane in the x/y direction. At the same time, the length of the region spanned by an individual cord element 105 may be modified. This may be done by the rings 21A, 21B on the end side, which are connected to a particular cord element 105, being adjusted in different rotation directions from one another. In this way, for example, adaptation of the shift of the natural frequency of a natural oscillation mode may also be achieved by modification of characteristic lengths that have an oscillation plane in the z direction.

It is furthermore conceivable for the stress element mentioned with respect to the cord element 105 also to be provided for a leaf spring element. This stress element may, for example, be formed like a drivable actuator or setter 110 that is described in more detail with reference to FIG. 6. Nevertheless, any other device that permits deflection of the cord element 105 or the leaf spring element transversely to the z direction may also be envisioned. A variation of the stress or pre-stress of the cord elements or leaf spring elements may, for example, be carried out with the aid of the drivable stress element.

Figure 5:
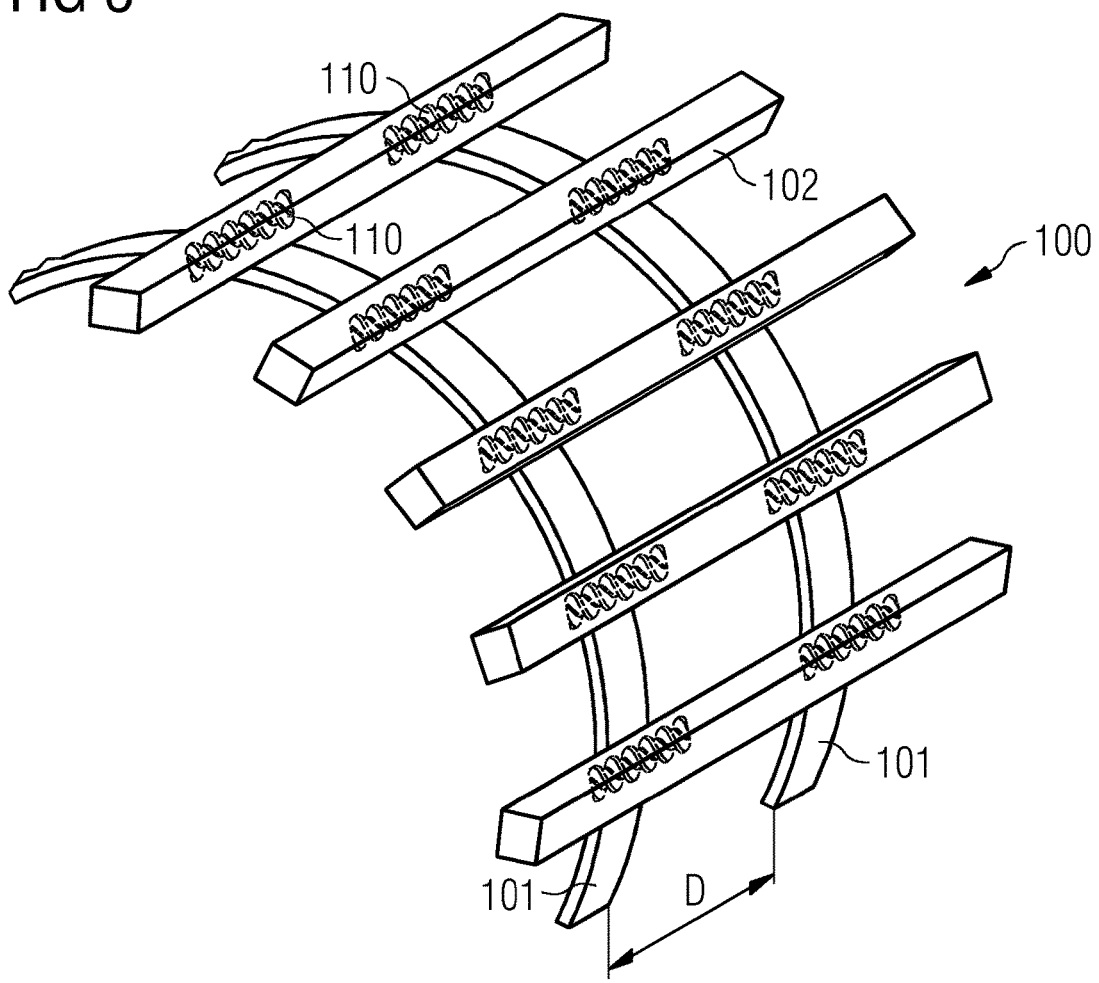
FIG. 5 depicts an embodiment of a refinement of the adjustment device according to FIG. 1, which is adjustable.

FIG. 5 depicts a variant of the ladder-like adjustment device 100 known from FIG. 1, which includes an arrangement of a plurality of leaf spring elements 101, 102. Two longitudinally extending leaf spring elements 101, the main spring elements 101, are in this case arranged at a distance D from one another. These longitudinally extending leaf spring elements 101 are furthermore connected in a mobile fashion to leaf spring elements 102, the rung springs 102, arranged transversely thereto. The distance D between the longitudinally extending leaf spring elements 101 may in this case be varied by actuators or setters 110, which are respectively formed by a threaded section. With the aid of the described setters 110, (e.g., a plurality of adjustment units), all of which are associated with an adjustment device 100, an arrangement of leaf spring elements according to the exemplary embodiment of FIG. 2 or 3 may be adapted in such a way that a plurality of differential frequencies may be set during operation of the assigned magnetic resonance imaging system.

Figure 6:
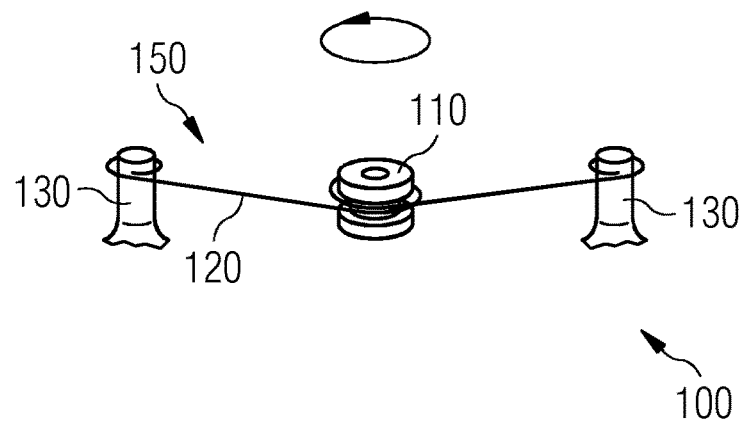
FIG. 6 depicts an embodiment of an adjustment device in the form of an adjustable stress device.

FIG. 6 depicts another alternative adjustment device 100 that is formed as a stress device 150. The stress device 150 in this case includes two fastening elements 130 arranged at a distance from one another. The fastening elements 130, which are formed in the shape of rods in this exemplary embodiment, may be connected to the lateral surface of the body coil or on the support tube, and are used as holders 130 for a stressing cable 120. It is also conceivable for the holders 130 to be formed in a different way, for example, as a hook or as a ring. The fastening element 130 may in particular be contained in one piece in the support tube 20. The stressing cable 120, respectively connected at the end to the holders 130, may be made of a nonconductive material, in particular, synthetic fibers or nonmagnetic steel wires, and elastic (to a certain extent). The stressing cable 120 may therefore also be used as a damping element 120. The cable 120 is connected to an actuator or setter 110, which may vary the cable tension. The setter 110 may be formed as a controllably driven roll 110, around which the stressing cable 120 is wound. By rotating the roll 110, it is possible to modify the number of turns of the stressing cable 120 extending around the roll 110, or the proportion of the length of the stressing cable 120 that extends around the roll 110. The cable tension acting on the fastening elements 130 may thereby be modified. Overall, a drivable adjustment device 100 is thus provided, which is formed as a stress device. If the stress device is connected to the support tube 20 of the body coil 10, for example, a reversibly variable force may be applied to the section of the support tube 20 extending between the fastening elements 130. This force may be described by a modified modulus of elasticity of the support tube 20, so that a shift of natural frequencies may ultimately be rapidly calculated analytically with the aid of the modified modulus of elasticity. This makes it possible, in particular, to set one or more predetermined differential frequencies rapidly and in a controlled way.

Figure 7:
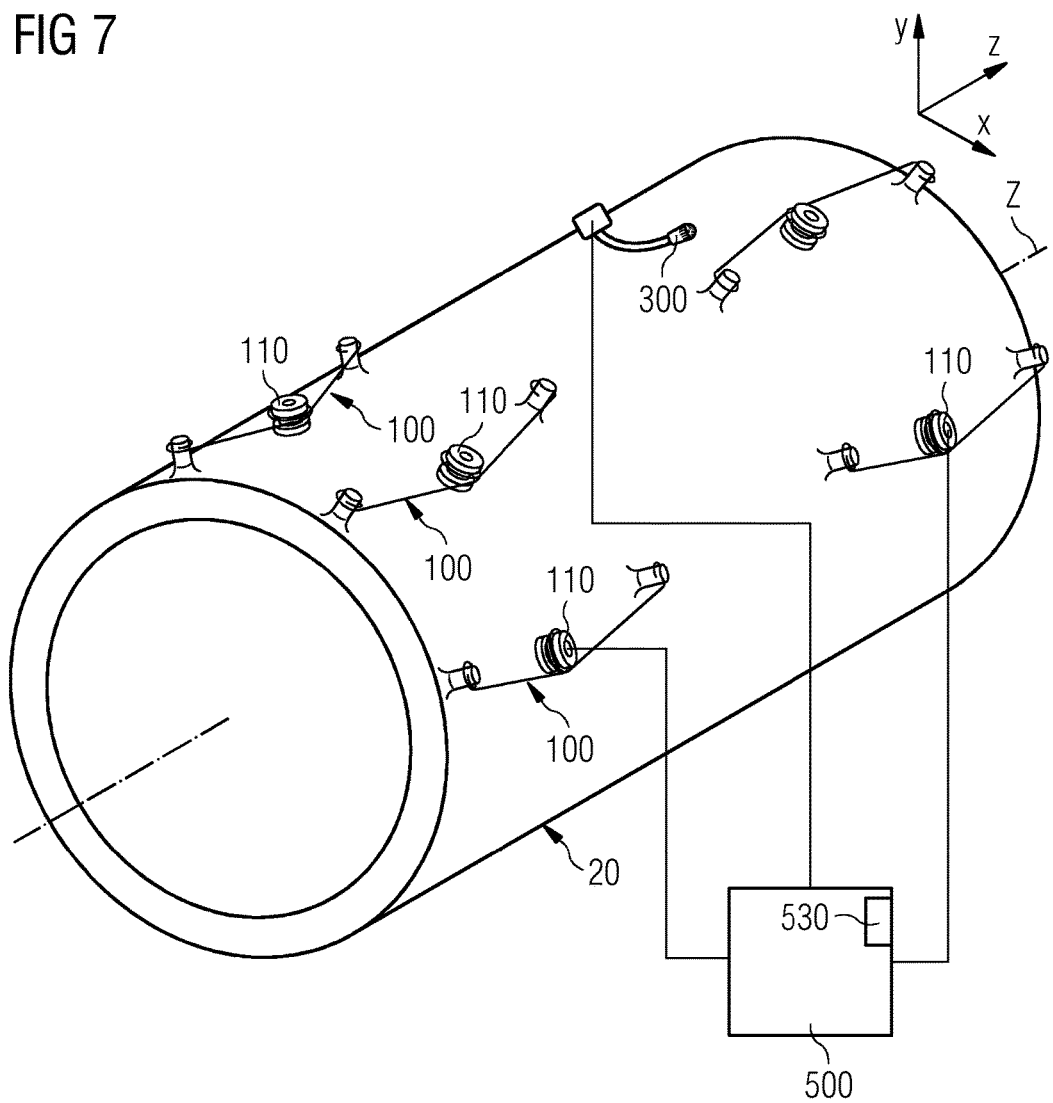
FIG. 7 depicts an embodiment of an arrangement of a plurality of adjustment devices according to FIG. 6, which are connected to an outer side of the support tube of a body coil and which are adjustable by a differential frequency control device during operation of the associated MR system.

FIG. 7 depicts an arrangement of a plurality of adjustment devices 100 according to an exemplary embodiment of FIG. 6. A plurality of adjustment devices 100 are in this case arranged on an outer surface of the support tube 20 of the body coil 10, the lateral surface. The stress device or the cable 120 in this case extends parallel to the z direction. With the aid of the setters 110, each device of the plurality of adjustment devices 100 may be set individually in such a way that each device respectively exerts a particular force in the longitudinal direction, (e.g., parallel to the z direction), over a particular section of the support tube 20. Owing to the fact that the action of force may be set differently with the aid of the plurality of setters 110, it is possible to divide the support tube 20 into a plurality of sections, or characteristic lengths, both in the longitudinal direction of the support-tube cylinder and in the plane transverse to the z direction. It is therefore possible to achieve almost any desired shift of natural oscillation frequencies. In addition to shifting the natural oscillation frequencies, damping is simultaneously set with the aid of the cable 120. In this case, it may be taken into account that not only does the cable 120 itself act as a damping element 120, but also the damping properties of the support tube 20 itself are also modified by the controlled variation of the modulus of elasticity of the support tube 20.

This provides that, in addition to the shift of the natural frequencies, damping of particular frequencies, in particular natural frequencies of the antenna system 10, is also possible. The damped frequencies may also be selected, in particular independently of the shift of the natural frequencies of the antenna system 10. This independence may be achieved, as depicted, by using a plurality of adjustment devices 100 that may be adjusted independently of one another.

This offers various advantages. In this way, not only may the oscillation energy transmission to the antenna system be reduced by a frequency shift occurring, but in addition it is also possible to damp frequencies that, for example, correspond to a natural frequency of a support structure described in more detail below.

By virtue of the damping, for example, with respect to a natural frequency of the antenna system 10 and/or of other components or combinations of components of the magnetic resonance imaging system, which have the greatest amplitude during operation of the magnetic resonance imaging system, it is possible to achieve damping of odd harmonics in such a way that a multiplicity of even harmonics are generated. The effect of this is that the noise spectrum, which is propagated in particular by vibration of the body coil, is perceived as pleasant by the patient.

As a drive for varying the cable tension or as actuators, for example, devices may be envisaged that are based on pneumatic, hydraulic, piezoelectric or magnetic force. The drive may in this case include hydraulic or pneumatic pumps, motors, piezo elements, (electro)magnets, hydraulic or pneumatic muscles, or fillable pressure elements, or heating elements. The cable tension may in this case, as depicted, be varied by a force action in a central region of the stressing cable 120. Likewise, it is also conceivable for the cable tension to be varied by an action of force on an engagement point at the end, for example, as explained with reference to FIG. 4.

The drive may also be used, according to the exemplary embodiments described above, in order to adjust the cord elements or spring elements.

The drive may be driven with the aid of a differential frequency control device 500. The differential frequency control device 500 is formed for dynamic determination, e.g., individually for the patient, of the critical frequency range. The differential frequency control device 500 may also have a frequency range interface 530 for receiving a dynamically determined critical frequency range. The interface 530 may, for example, also be used in order to convey a specification for a differential frequency.

Furthermore, the differential frequency control device 500 may be connected to one or more sensors 300 that acquire vibrations of the antenna system 10 and/or of other components of the magnetic resonance imaging system. In the exemplary embodiment, a microphone is arranged in the immediate vicinity of the support tube 20 so that the microphone may record the sound emission of the support tube 20, and therefore the vibrations of the antenna system 10, during operation. On the basis of the sensor measurement data, these sensors 300 may establish a differential frequency with which a shift of a natural frequency of the antenna system 10 is carried out.

Figure 8:
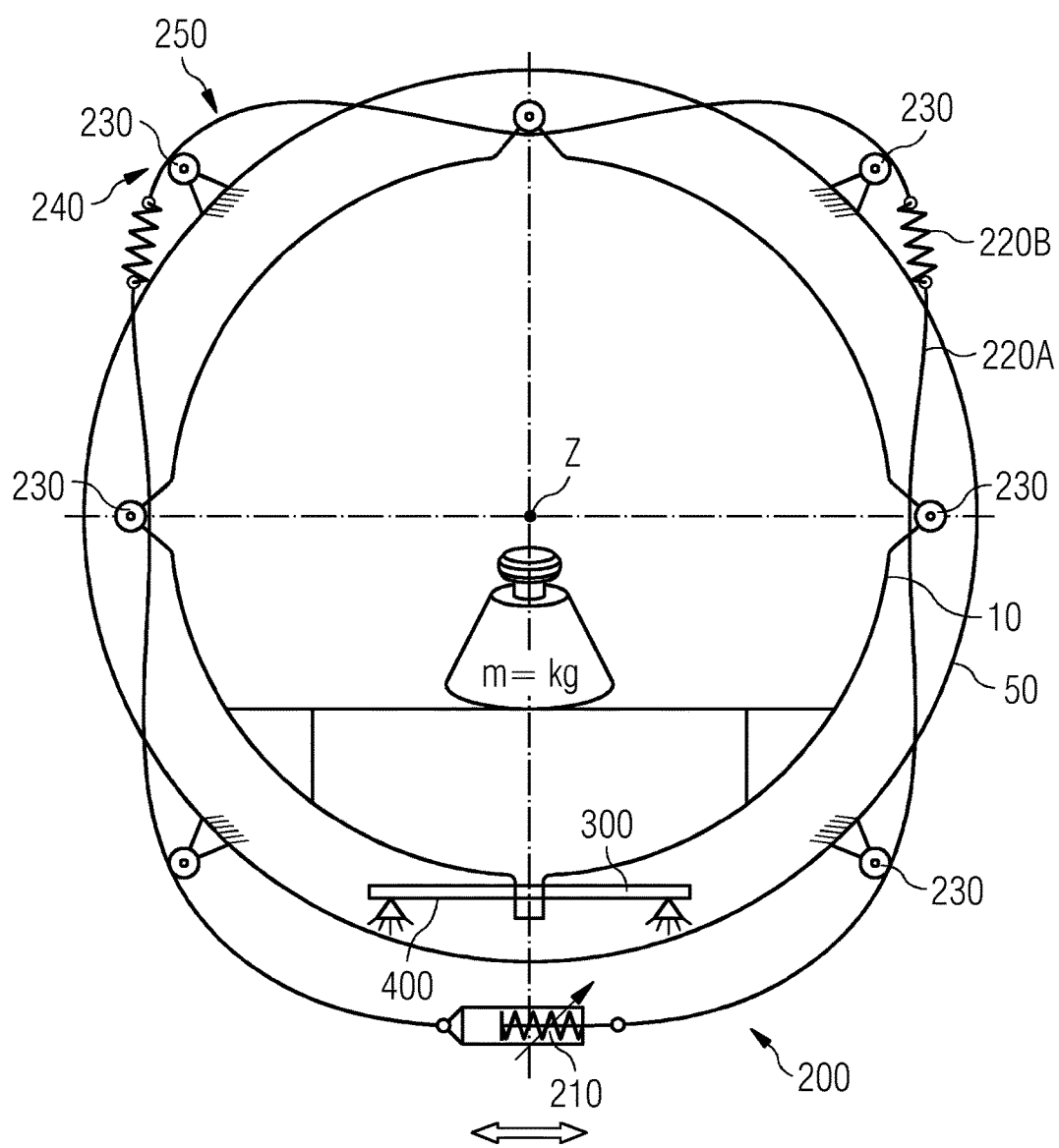
FIG. 8 depicts an embodiment of a body coil, which is connected to a gradient coil by a suspension system that includes a cable, the tension of the cable being adjustable by a controllable actuator.

During the variation of natural oscillations in order to improve the image quality, or the patient comfort, it may be noted that the body coil 10 may be connected to the gradient coil 50 by a suspension system 200, as is depicted in FIG. 8. The gradient coil 50 is in this case used as a support structure 50 for the body coil 10.

Alternatively, for example, it is also conceivable for the body coil 10 to be connected to a base field magnet of the magnetic resonance imaging system (or the housing thereof), which is used as a support structure 50, as will be described in more detail below with reference to FIG. 11.

In practice, this provides that the excitation of natural oscillation modes of the antenna system 10 is also determined crucially by the transmission of oscillation energy of the support structure 50 to the suspension system 200, and consequently to the body coil 10. Reduced transmission of oscillation energy leads to reduced vibrations of the antenna system 10.

The transmission of oscillation energy to the body coil 10 by the suspension system 200 may be described in this case as a model by a coupling parameter value, which is, for example, a spring constant of the coupled-pendulum model already discussed in the introduction.

FIG. 8 depicts an examination object O, or patient, symbolized by a weight, which is arranged in the patient tunnel of the magnetic resonance imaging system 1. The patient O has a mass m. Since the patient table on which the patient lies is mounted inside the support tube 20 of the antenna system 10, the antenna system 10 is deflected by a certain distance relative to the gradient coil 50 by the mass m. Furthermore, the amount, the position and the distribution of the weight m of the patient O also determine possible natural frequencies of the antenna system 10 and furthermore of the coupled system includes the antenna system 10, suspension system 200 and support structure 50.

A shift or displacement of the antenna system 10 relative to the gradient coil 50 is also disadvantageous, in particular since an RF shield of the gradient coil 50 may, at the same time, carry a return current for generating the $B_1$ field. With a concentric arrangement of the body coil 10 and the gradient coil 50, an optimal electrical function of the body coil 10 is provided. In particular, any asymmetry in the distance between the body coil 10 and the gradient coil 50 may lead to the transmission power of the body coil 10 having to be increased relative to a concentric arrangement, in order to set a given predetermined target magnetization of the examination object. One consequence of this would be an increase in the patient's specific absorption rate (SAR).

It is therefore desirable to correct this weight-dependent shift or displacement, individual to the patient, of the antenna system 10 relative to the gradient coil 50.

The suspension system 200 is formed in the exemplary embodiment of FIG. 8 by a multiplicity of fastening elements 230 in the form of rolls 230 that, respectively together with an associated holder, form a suspension unit 240. The rotation axis of the rolls 230 in this case extends parallel to the z direction. A first set of four rolls 230 is mounted on holders that are connected to an outer surface of the body coil 10. These four rolls 230 are distributed uniformly over the circumference of the lateral surface of the cylindrical body coil 10. A second set of four rolls 230 is arranged on an outer surface of the gradient coil 50. These further four rolls 230 are arranged uniformly distributed over the circumference of the lateral surface of the cylindrical gradient coil 50. A stressing cable 220A extending around the outer lateral surface of the body coil 10 is guided by the eight rolls 230, specifically in such a way that, in the profile of the cable 220A, the cable 220A is guided in continuous succession around one roll 230, which is connected to the body coil 10, and, immediately subsequently in the profile of the cable 220A, around a roll 230 that is connected to the gradient coil 50. The cable has a plurality of additional damping elements 220B in the form of springs 220B, and the position of the antenna system 10 relative to the gradient coil 50 may furthermore be set by a setter 210 in the form of a controllable spring element, which is contained in the cable 220A extending around. The setter 210 forms a drivable setting mechanism of the suspension system 200. The magnetic resonance scanner 2 furthermore has a sensor 300 in the form of a glass scale element, which is simultaneously part of a position determination device 400. With the glass scale element, on which a pattern of optically transmissive and optically opaque regions is applied as an information medium, a position change of the antenna system 10 may be recorded and quantified. That is to say, a relative position of the antenna system 10 with respect to the body coil 10 may be determined. To this end, the glass scale element is illuminated with the aid of a laser and a resulting light intensity is evaluated. From this, it is possible to calculate the relative position of the antenna system 10 with respect to the support structure 50, or the deflection of the antenna system 10 relative to the support structure 50. The information about the deflection may be used in order to reset the position of the body coil 10 concentrically with the gradient coil 50 by the setter 210, for example, by varying the spring hardness.

Furthermore, by time-dependent recording of the deflection of the body coil 10 relative to the gradient coil 50, it is also possible to determine a natural frequency spectrum of the antenna system 10 and/or of the coupled system including the antenna system 10, suspension system 200 and support structure 50. This determination of the natural oscillation frequency spectrum is carried out dynamically during operation of the MR system, while taking the patient's weight into account. From this, a differential frequency may be calculated, which is necessary in order to shift natural frequencies of the antenna system 10 and/or of the coupled system including the antenna system 10, suspension system 200 and support structure 50, outside the critical frequency range.

Figure 9:
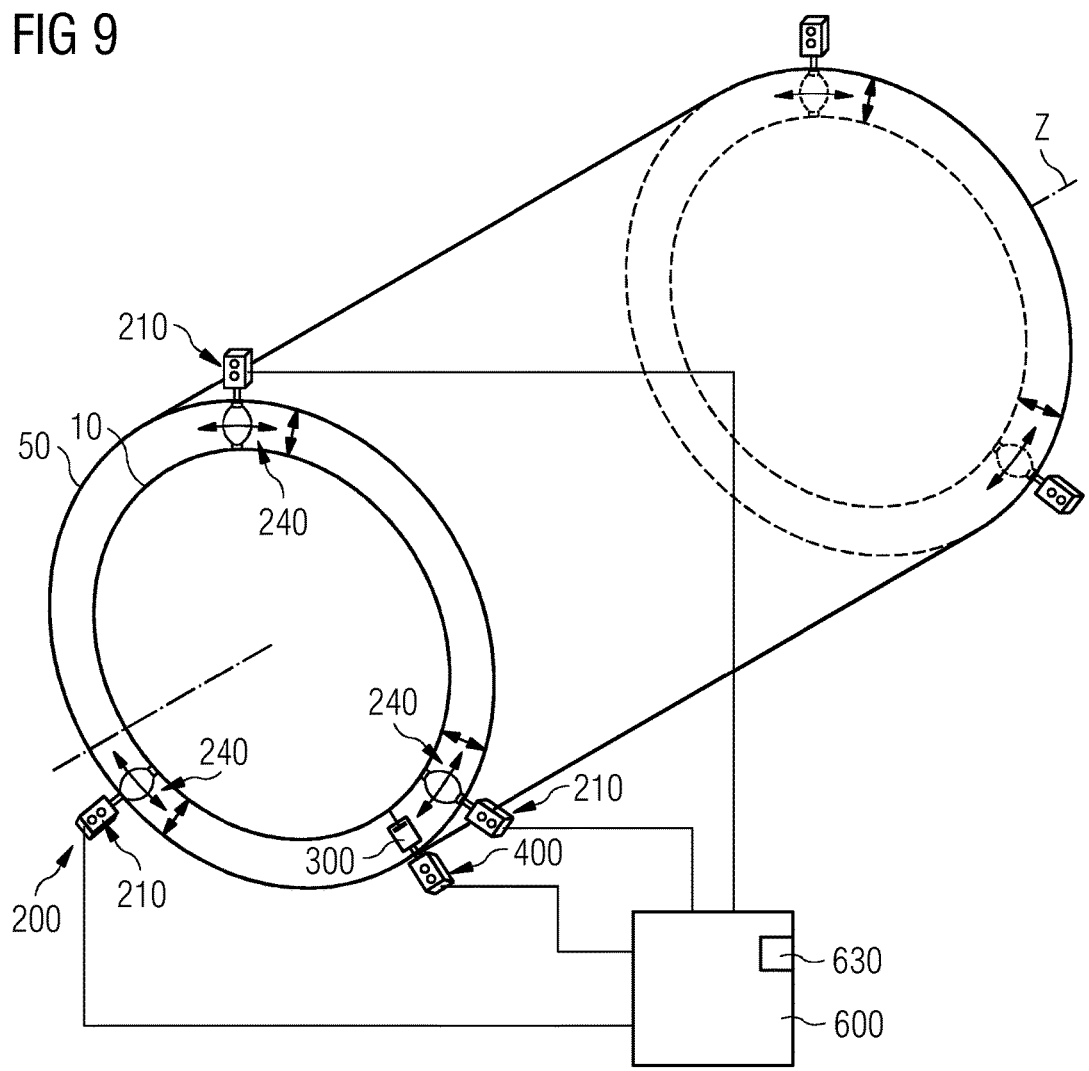
FIG. 9 depicts another exemplary embodiment of a body coil, which is connected to a gradient coil by adjustable air cushions, the air cushions being arranged uniformly distributed over the circumference of the cylindrical body coil.

FIG. 9 depicts a suspension system 200, which includes a plurality of actuators/setters 210 or drivable setting mechanisms that in this case are formed as air cushions or "air muscles" 210 and which support the body coil 10 relative to the gradient coil 50 while being uniformly distributed over the circumference of the former at a plurality of points. The setters 210, (e.g., the pressure elements that may be filled with a fluid), therefore simultaneously form suspension units 240. The exemplary embodiment represented includes two groups of three air muscles that are respectively arranged in the region of the end side of the body coil 10. The air pressure in the setter 210 is in this case adjustable, e.g., the driving of the setter 210 is carried out pneumatically. To this end, the air muscles 210 may be connected individually or as a whole, for example, to a pump system for a filling medium, which may also be activated during operation of the magnetic resonance imaging system.

As an alternative to the configuration as air muscles, other filling media may in this case also be envisioned, (e.g., oil, helium or nitrogen). To this extent, for example, a hydraulic drive of the setters 210 may also be provided, and there may be a corresponding pump system as the drive.

A suitable combination of a plurality of filling media may also be used that, for example, have different damping properties or different compressibility. In this case, it is also conceivable for at least one of the setters 210 to be operated with a different filling medium than the other setters 210. That is to say, the damping properties of the setter 210 that is operated with a different filling medium are such that the damping properties are maximal at a different frequency than for the other setters 210. It is therefore possible to produce and modify damping that is effective over a wide frequency range by a multiplicity of connection points between the body coil 10 and the gradient coil 50. This is advantageously possible by individual driving of the setters 210, for example, with different filling pressures.

At the same time, by the modified damping, the described coupling parameter value of the coupled system including the antenna system 10, suspension system 200 and support structure 50, is also varied. That is to say, the possible natural oscillation modes or natural frequencies of the coupled system may also be varied with the aid of the setters 210. In particular, this variation is also reversible.

Furthermore, the suspension system 200 includes a sensor 300 that is formed both in order to determine natural oscillations of the antenna system 10 that occur and simultaneously may also be used as part of a position determination device 400.

In this case, the magnetic scanner may also include a plurality of sensors 300, so that, for example, the deflection of the antenna system 10 is acquired not only at a single position. In this way, for example, it is possible to determine the weight distribution of the patient in the magnetic resonance imaging system, so that the patient's weight distribution may also be taken into account in the shift and/or damping of (natural) frequencies.

Figure 10:
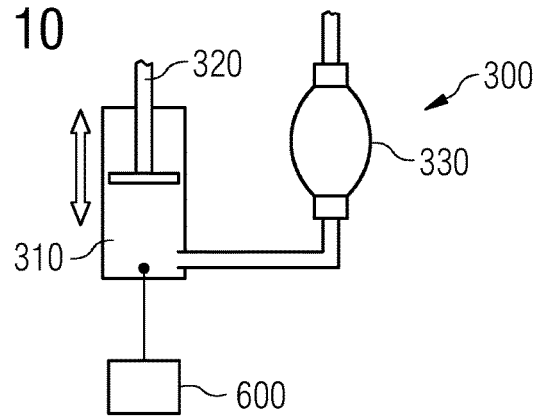
FIG. 10 depicts an embodiment of a sensor that is used to determine the deflection of the body coil relative to the gradient coil.

The sensor 300 is represented in more detail in FIG. 10. FIG. 10 depicts a piston 320 that may be displaced in a particular direction in a cylinder 310, which is filled with a measurement medium, (e.g., oil, air, helium, or nitrogen). The direction of the displacement may coincide with a direction in which associated setters 210 may exert a force. The measurement medium may be the same medium as that with which one of the setters 210 is operated. The cylinder 310 is coupled to a compensation container 330, and in the event of movement of the body coil 10 the piston is moved in the cylinder proportionally to the deflection of the body coil 10. The compensation container 330 may be closed, so that the movement of the piston causes a pressure difference in the measurement medium. The pressure difference may be determined, so that a deflection of the body coil 10 may be calculated therefrom. Pressure sensors, (e.g., piezoelectric sensors, capacitive sensors, glass measuring scales or strain gauge strips), may equally be used in this case.

Alternatively, it is conceivable for the compensation container 330 to be open. The filling level of the measurement medium in the compensation container may be determined in order to ascertain the deflection of the body coil 10.

In this way, it is possible to determine the relative position of the body coil 10 with respect to the support structure, or gradient coil 50. The sensor 300 therefore becomes part of a position determination device 400. A correction of the position of the body coil 10 relative to the gradient coil 50 may be carried out in a similar way as in the exemplary embodiment of FIG. 8 by actuating the setters 210, although in this case these are formed by the described air muscle system, or a system of pressure elements that may be filled with a fluid.

The sensor 300 is, as represented in FIG. 9, connected to a suspension control device 600 that is formed in order to vary, control and in particular regulate the relative position of the antenna system 10 relative to the support structure 50.

The active suspension system 200 of FIG. 9, in combination with the suspension control device 600, makes it possible to automatically keep the position of the body coil 10 relative to the gradient coil 50 essentially constant, (e.g., in a mutually concentric arrangement of the body coil 10 and the gradient coil 50), irrespective of the weight load due to a patient.

Furthermore, the suspension control device 600 is formed in order to actuate the arrangement of setters 210 in such a way as to carry out a shift of a natural frequency of the coupled system including the antenna system 10, suspension system 200 and support structure 50. By virtue of the multiplicity of individually actuable setters 210, the shift of natural frequencies may be carried out independently of the correction of the relative position of the body coil 10 relative to the gradient coil 50.

The suspension control device 600 may have a frequency range interface 630, by which information about the critical frequency range may be dynamically received. The critical frequency range may be provided by an expert system. It is likewise conceivable that a differential frequency for shifting natural frequencies of the antenna system 10 and/or of the coupled system, including the antenna system 10, suspension system 200 and support structure 50, are already provided by this interface 630. Furthermore, the suspension control device 600 may be formed in order to dynamically determine a differential frequency while taking the aforementioned sensor measurement data into account.

The pressure of the filling medium in the individual air muscles may be varied in such a way that a shift by a predetermined differential frequency takes place.

Figure 11:
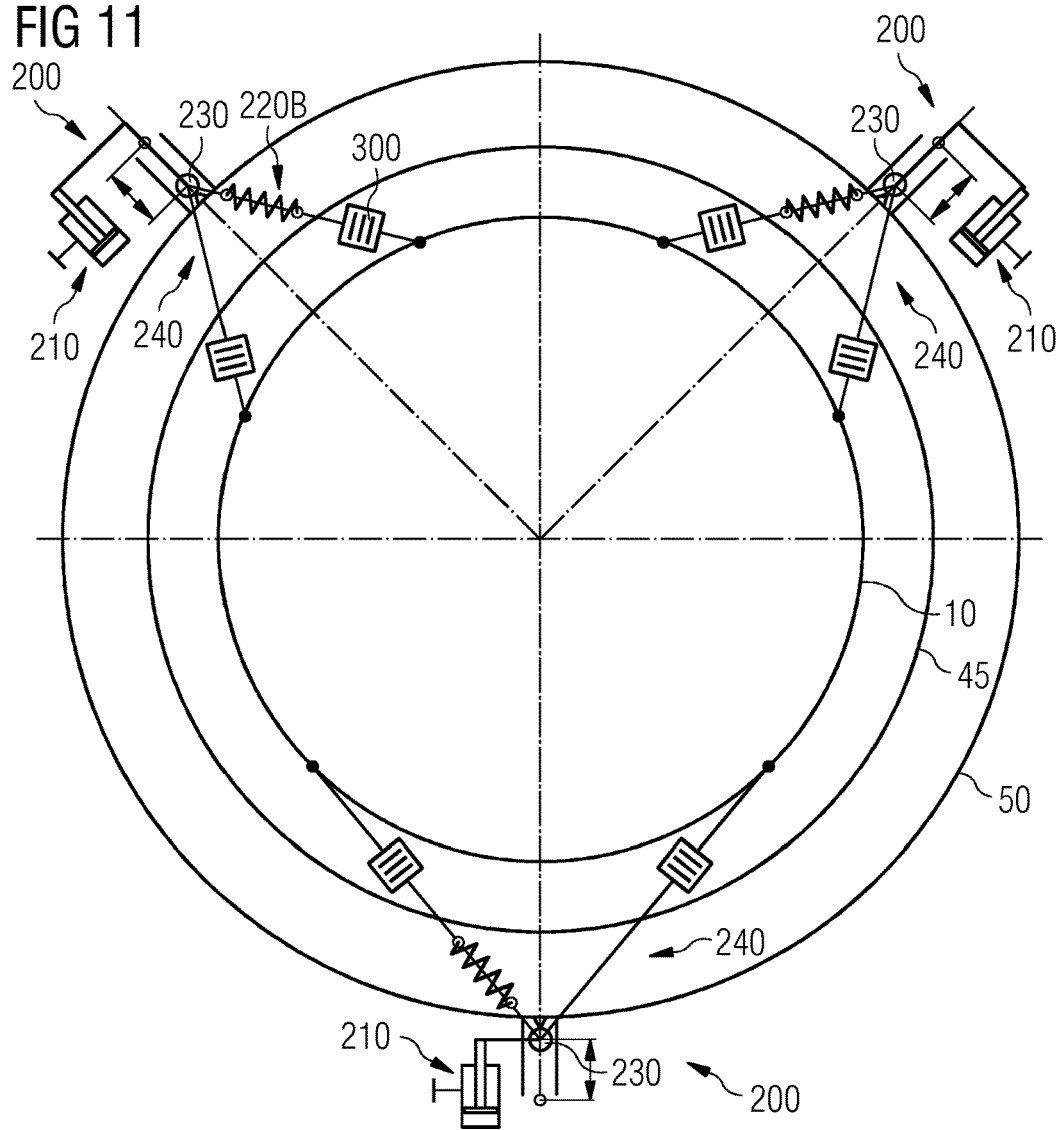
FIG. 11 depicts an exemplary embodiment of a body coil, which is connected to a support structure of a magnetic resonance imaging system.

An alternative suspension system 200, which is likewise formed in order to reversibly vary a coupling parameter value between the body coil 10 and the support structure 50 with the aid of a suspension system 200, is represented in FIG. 11. In the radial direction, considered transversely to the z direction, the gradient coil 45 is arranged between the support structure 50 and the body coil in this exemplary embodiment. The suspension system 200 in this case includes a plurality of suspension units 240, on which the antenna system 10 is coupled to a support structure 50 at different points of the antenna system 10. A first suspension unit 240 is fastened on a support structure 50, for example, on a housing of a base magnet of the magnetic resonance scanner. The suspension unit 240 includes a fastening element 230 in the form of a roll, the rotation axis of which extends parallel to the z direction. An elastic cable 220A, which is likewise part of the suspension unit 240 and which is connected to the antenna system 10 by both ends, may extend around the roll 230. The cable 220A includes a spring 220B, which acts as a damping element 220B, and the cable 220A furthermore respectively includes a strain gauge strip 300 that is used as a sensor element 300, in order to acquire a natural frequency of the antenna system, or of the coupled system including the antenna system, suspension system and support structure 50. At the same time, the strain gauge strips 300 are also used to determine the relative position of the antenna system 10 with respect to the support structure 50. In particular, the cable tension in the different cables 220A may be determined directly. The strain gauge strips 300 are accordingly to be regarded as part of a position determination device 400. The fastening elements 230 are in this case formed so that fastening elements 230 are mobile relative to the support structure 50. The fastening elements 230 may be displaced transversely to the z direction and thus make it possible to vary the cable tension. Compensation of vibrations of the antenna system and/or of weight changes during operation, for example, due to repositioning of the patient, may therefore be carried out by different tensions of the cable 220A.

The displacement may be carried out in a similar way to the sensor 300 of the exemplary embodiment of FIG. 10, with the aid of a setter 210 that is formed as a piston in a cylinder. The filling quantity, or the pressure, of the filling medium in the cylinder may in this case be varied, so that the setter 210 may modify the position of the roll 230 relative to the support structure 50 transversely to the z direction. In the exemplary embodiment, the displacement is carried out in such a way that the distance of the roll 230 from the antenna system 10 is also varied. By this variation, it is possible not only to set the relative position of the antenna system 10 with respect to the support structure 50, but also to vary the cable tension. Therefore, a coupling parameter value of the mechanical coupling of the antenna system to the support structure 50 may simultaneously be set, independently of the correction of the relative position of the antenna system 10 with respect to the support structure 50. Alternatively, it is also conceivable for the springs 220 to be formed so that the springs may be adjusted in their spring hardness, so that the cable tension may be varied. The adjustment of the position of the fastening elements 230 may be carried out synchronously, so that the fastening elements 230 are used to correct the position of the body coil 10 relative to the gradient coil. This in turn allows, in a straightforward way, independent variation of the position of the antenna system 10 and of the variation of natural frequencies of the coupled system including the antenna system 10, suspension system 200 and support structure 50.

Figure 12:
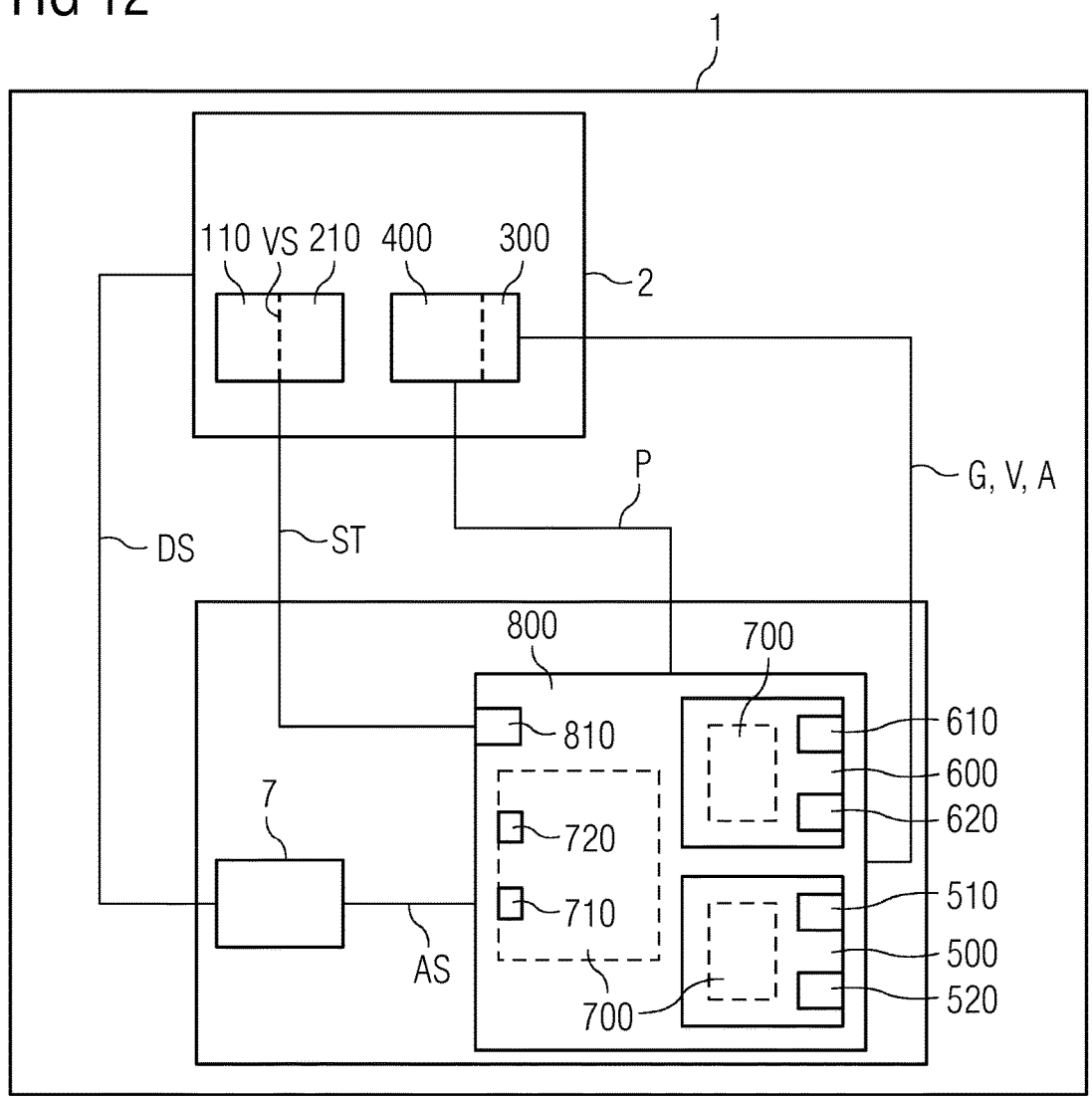
FIG. 12 depicts an embodiment of an antenna vibration control system that controls, or regulates, an adjustment device and a setting mechanism on the basis of a prediction by an expert system of a critical frequency range and sensor measurement data, in particular the weight of an examination object.

FIG. 12 schematically depicts the way in which, for example, driving or regulation of the setters 110 of the antenna system and/or of the setters 210 of the suspension system, which may together form a common adjustment system VS, may be carried out.

The MR system 1 has a main control instrument 5 with a sequence control instrument 7. The sequence control instrument is used to transmit drive sequence data AS to a scanner 2 of the magnetic resonance imaging system 1, in order to drive the scanner 2 suitably for a magnetic resonance data acquisition to be carried out. The drive sequence data AS are provided to an antenna vibration control system 800 before or during the magnetic resonance measurement to be carried out. The antenna vibration control system 800 includes a differential frequency control device 500 and a suspension system control device 600, as well as optionally an expert system 700 that which is formed in order to predict the critical frequency range or a vibration spectrum or natural oscillation spectrum of the antenna system, or of the combination of the antenna system, suspension system and support structure, on the basis of the drive sequence AS and optionally sensor measurement data.

The sensor measurement data may, for example, be weight data G of the examination object, obtained with the aid of the sensors 300, in particular the weight distribution of the examination object, vibrations or vibration data V, or image artifacts, in particular artifact frequencies A or natural frequencies of the examination object, appearing during operation of the magnetic resonance imaging system. Furthermore, the sensor information may also include measurement data that is supplied to the position determination device 400, which calculates position data P of the antenna system therefrom and sends the data to the antenna vibration control system 800. Alternatively, the position data P may also be determined within the antenna vibration control system 800 on the basis of sensor measurement data.

A multiplicity of different sensors 300 may be used. For the position determination, for example, laser, ultrasound or glass scale systems may be envisioned. Furthermore, the position determination may be carried out on the basis of the analysis of an electrical scattering parameter matrix, which may be compiled for calibration or setting of radiofrequency voltage amplitudes and/or radiofrequency voltage phases for operation of the antenna system. The antenna system itself, in combination with a transmission and/or reception unit, is used as a sensor 300 for the position determination. The position determination may be carried out in such a way that a threshold value is assigned to each element of the scattering matrix and the position of the antenna system relative to the support structure is determined by analysis of the exceeding of the threshold value. The position determination device 400 may be formed in order to carry out this analysis.

In order to determine natural frequencies of the examination object, respiratory belts or ECG devices may be used as sensors 300. Furthermore, it is possible to evaluate MR image data with respect to the natural frequencies of the examination object. In this regard, a reconstruction unit for reconstructing MR image data may also be used as a sensor 300.

The aforementioned strain gauge strips or, for example, piezo transducers, may determine the tension conditions of cables, cords or springs, or the load of individual fastening elements or suspension units due to the antenna system. In this way, in particular, a weight distribution of the examination object in the MR system, or the antenna system, may be determined. To this end, the expert system 700 or the differential frequency control device 500 and the suspension system control device 600 have a weight data interface 520, 620, 720.

With the aid of the expert system 700, it is possible in particular to pre-calculate the spectral distribution of the antenna system vibrations to be expected, e.g., the natural frequencies of the antenna system and/or the combination of the antenna system, suspension system and support structure, for example, in a currently set starting position of the adjustment devices and/or of the drivable setting mechanisms, and compare this with the critical frequency range.

Furthermore, it is also possible to measure the vibration spectrum of the antenna system, e.g., in particular natural frequencies of the antenna system and/or of the combination of the antenna system, suspension system and support structure, with the aid of vibration sensors. The suitable sensors may be vibration sensors, for example, acceleration sensors or microphones, arranged in, at or on the body coil.

The comparison between the critical frequency range and the predicted or measured natural frequencies may be carried out by the expert system 700.

The expert system 700 is formed in order to already determine one or more differential frequencies on the basis of the comparison, specify the frequencies for one or more natural oscillation modes, and send the frequencies to the differential frequency control device 500 and/or to the suspension system control device 600.

Alternatively, the comparison may be carried out by the differential frequency control device 500 and/or the suspension system control device 600.

To this end, the critical frequency range and/or an oscillation spectrum that is to be expected or has been measured is sent to the differential frequency control device 500 and/or to the suspension system control device 600, for example, by the expert system 700. The critical frequency range that is sent to the differential frequency control device 500 may in this case be different than the critical frequency range that is sent to the suspension system control device 600.

Alternatively, the differential frequency control device 500 and/or the suspension system control device 600 may also be formed in order to predict and/or empirically determine the respective critical frequency range and/or the respectively relevant oscillation spectrum, for example, on the basis of drive sequence data AS and/or sensor measurement values, in particular weight data G.

For example, to this end, the expert system 700 may also be integrated into the differential frequency control device 500 and/or into the suspension system control device 600. The differential frequency control device 500 and the suspension system control device 600 may, in particular, also be formed as one component.

If a differential frequency is not already specified, for example, by the expert system 700, the differential frequency control device 500 determines a differential frequency in order to shift a natural frequency of the antenna system out of the critical frequency range. On the basis of the determined or specified differential frequency, the differential frequency control device 500 drives the setters 110 of the antenna system appropriately.

In the same way, the suspension system control device 600 determines a coupling parameter value on the basis of the differential frequency that shifts a natural frequency of the coupled system, including the antenna system, suspension system, and support structure, in such a way that the frequency lies outside the critical frequency range, and drives the setters 210 of the suspension system appropriately.

The driving of the setters 110, 210 is carried out by sending control data ST by a control interface 810, which the antenna vibration control system 800 includes. Optionally, the differential frequency control device 500 and/or the suspension system control device 600 may likewise have a control interface for sending control data ST to the setters 110, 210. In this case, the control interface 810 of the antenna vibration control system 800 may also be obviated.

The comparison between the natural frequency spectrum, or vibration spectrum, and the critical frequency range may in this case be carried out repeatedly. For example, a differential frequency may be determined or specified iteratively on the basis of the aforementioned sensor measurement data. The iterative specification is carried out, for example, by variation calculation. That is to say, the setters 110, 210 are driven with control data ST and a difference from an expected natural frequency set with the aid of control data ST, or differential frequency, is determined. The control data ST are varied iteratively until the difference is minimal.

The iterative specification may also be carried out in such a way that drive sequence data AS are taken into account in the variation calculation. To this end, the expert system or the differential frequency control device 500 and/or the suspension system control device 600 have, for example, a sequence interface 510, 610, 710.

The embodiments therefore provide a range of possibilities for minimizing influences of oscillations of an antenna system on the quality of the imaging or the patient comfort, or the patient's SAR. To this end, for example, the adjustment of the body coil before delivery of the associated magnetic resonance imaging system and also continuously, for example, during maintenance work and in particular during operation of the MR system, is simplified in that the adjustment may be carried out dynamically and, in particular, automatically improved iteratively. The vibration problem with respect to the imaging may be reduced without it being necessary to damp the entire vibration spectrum. The automatic adjustment of the position of the body coil inside the gradient coil, so that the position is independent of the weight load due to a patient, leads to an advantage in terms of the patient's SAR and the energy budget of the MR scanner. This particular advantage is important especially in the case of antenna systems that are connected to a plurality of transmission channels (so-called TX arrays) of the MR system.

Finally, it may be pointed out that the features of all exemplary embodiments, or refinements disclosed in figures, may be used in any desired combination. It is likewise to be pointed out that the medical technology imaging system described in detail above, the MR scanner, and the method for operating an MR system and for setting a natural frequency of an antenna system mechanically connected to a magnetic resonance imaging system, are merely exemplary embodiments that may be modified by the person skilled in the art in a wide variety of ways without departing from the scope of the embodiments. In particular, the described drive may be used with any type of the setters described. Furthermore, the use of the indefinite article "a" or "an" does not preclude the possibility that there may be several of the relevant features. Likewise, the term "unit" does not preclude the possibility that the relevant components may consist of a plurality of interacting subcomponents, which may optionally also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance scanner comprising:
an antenna system having an adjustment device,
wherein the adjustment device is configured to modify a natural frequency of a natural mechanical oscillation mode of the antenna system, and
wherein the adjustment device is configured to:
shift the natural frequency by a first predetermined differential frequency for a first scan; and
shift the natural frequency by a second predetermined differential frequency for a second scan, the second predetermined differential frequency being different than the first predetermined differential frequency.

2. The magnetic resonance scanner as claimed in claim 1, wherein the adjustment device comprises a spring element.

3. The magnetic resonance scanner as claimed in claim 1, wherein the antenna system has a support element that carries an antenna element of the antenna system.

4. The magnetic resonance scanner as claimed in claim 3, wherein the adjustment device comprises a stress device that applies a mechanical stress to the support element of the antenna system.

5. The magnetic resonance scanner as claimed in claim 4, wherein the adjustment device is configured to be driven during operation of the magnetic resonance scanner.

6. The magnetic resonance scanner as claimed in claim 5, wherein the adjustment device is configured to modify the first differential frequency or the second differential frequency reversibly.

7. The magnetic resonance scanner as claimed in claim 1, wherein the adjustment device is configured to be driven during operation of the magnetic resonance scanner.

8. The magnetic resonance scanner as claimed in claim 1, wherein the adjustment device is configured to modify the first differential frequency or the second differential frequency reversibly.

9. The magnetic resonance scanner as claimed in claim 1, wherein the adjustment device comprises a damping element that is formed in order to absorb oscillation energy of the natural mechanical oscillation mode.

10. The magnetic resonance scanner as claimed in claim 1, wherein the oscillation spectrum of the antenna system comprises even harmonics of a natural oscillation.

11. The magnetic resonance scanner as claimed in claim 1, further comprising a support structure, wherein the support structure and the antenna system are mechanically coupled by a suspension system, the suspension system having a setting mechanism configured to reversibly set a coupling parameter value of the mechanical coupling between the antenna system and the support structure or a relative position of the antenna system with respect to the support structure.

12. The magnetic resonance scanner as claimed in claim 1, wherein the antenna system is a body coil.

13. The magnetic resonance scanner of claim 1, wherein the natural frequency is selected from a plurality of natural frequencies, and wherein the first or second predetermined differential frequency is based on the selected natural frequency.

14. A magnetic resonance imaging system comprising:
a magnetic resonance scanner having an antenna system,
wherein the antenna system comprises an adjustment device,
wherein the adjustment device is configured to modify a natural frequency of a natural mechanical oscillation mode of the antenna system, and
wherein the adjustment device is configured to:
   shift the natural frequency by a first predetermined differential frequency for a first scan; and
   shift the natural frequency by a second predetermined differential frequency for a second scan, the second predetermined differential frequency being different than the first predetermined differential frequency.

15. The magnetic resonance imaging system as claimed in claim 14, further comprising a differential frequency control device configured to control, regulate, or control and regulate the first predetermined differential frequency or the second predetermined differential frequency.

16. A method for operating a magnetic resonance imaging system having a magnetic resonance scanner comprising an antenna system, the method comprising:
   controlling or regulating a natural frequency of a natural mechanical oscillation mode of the antenna system in the magnetic resonance scanner; and
   shifting the natural frequency by a first predetermined differential frequency for a first scan and shifting the natural frequency by a second predetermined differential frequency for a second scan, the second predetermined differential frequency being different than the first predetermined differential frequency.

17. A method for setting a natural frequency of an antenna system mechanically connected to a magnetic resonance imaging system having an adjustment device for modifying a natural frequency of a natural mechanical oscillation mode of the antenna system, the method comprising:
   determining a natural mechanical frequency spectrum of the antenna system;
   determining a differential frequency by which a natural frequency of the natural mechanical frequency spectrum will be shifted; and
   setting the adjustment device so that the natural frequency is shifted by the determined differential frequency,
   wherein the natural frequency is selected from a plurality of natural frequencies, and wherein the determined differential frequency is based on the selected natural frequency.

18. The method as claimed in claim 17, wherein the determination of the natural mechanical frequency spectrum is carried out while taking into account weight data of an examination object that is to be imaged at least partially with the magnetic resonance imaging system.

19. The method as claimed in claim 17, wherein determining the natural mechanical frequency spectrum of the antenna system comprises determining the natural mechanical frequency spectrum of a body coil.

20. A magnetic resonance scanner comprising:
an antenna system having an adjustment device,
wherein the adjustment device is configured to modify a natural frequency of a natural mechanical oscillation mode of the antenna system,
wherein the antenna system has a support element that carries an antenna element of the antenna system,
wherein the adjustment device comprises a stress device that applies a mechanical stress to the support element of the antenna system,
wherein the stress device comprises a cable, a cord, or a cable and a cord, and
wherein a tension of the cable, a tension of the cord, or a tension of the cable and a tension of the cord are adjustable depending on the mechanical stress applied to the support element of the antenna system.

* * * * *